United States Patent
Ogura et al.

(10) Patent No.: US 10,345,936 B2
(45) Date of Patent: Jul. 9, 2019

(54) METHOD FOR PRODUCING CONDUCTOR-LAYER-PROVIDED STRUCTURE, SUBSTRATE-PROVIDED WIRING BODY, SUBSTRATE-PROVIDED STRUCTURE, AND TOUCH SENSOR

(71) Applicant: FUJIKURA LTD., Tokyo (JP)

(72) Inventors: Shingo Ogura, Chiba (JP); Takaharu Hondo, Chiba (JP); Takeshi Shiojiri, Chiba (JP)

(73) Assignee: FUJIKURA LTD., Tokyo (JP)

( * ) Notice: Subject to any disclaimer, the term of this patent is extended or adjusted under 35 U.S.C. 154(b) by 41 days.

(21) Appl. No.: 15/508,804

(22) PCT Filed: May 17, 2016

(86) PCT No.: PCT/JP2016/064577
§ 371 (c)(1),
(2) Date: Mar. 3, 2017

(87) PCT Pub. No.: WO2016/186104
PCT Pub. Date: Nov. 24, 2016

(65) Prior Publication Data
US 2017/0277289 A1 Sep. 28, 2017

(30) Foreign Application Priority Data
May 20, 2015 (JP) .................. 2015-103092

(51) Int. Cl.
*G06F 3/041* (2006.01)
*H05K 1/18* (2006.01)
(Continued)

(52) U.S. Cl.
CPC ............. *G06F 3/041* (2013.01); *G06F 3/044* (2013.01); *H01B 5/14* (2013.01); *H01B 13/00* (2013.01);
(Continued)

(58) Field of Classification Search
CPC ........... G06F 3/041; H01B 5/14; H01B 13/00; H05K 1/18; H05K 3/20; H05K 3/38; H05K 3/4682
(Continued)

(56) References Cited

U.S. PATENT DOCUMENTS

2003/0142486 A1* 7/2003 Arakawa ............. H05K 9/0096
361/818
2010/0230154 A1 9/2010 Naito et al.
(Continued)

FOREIGN PATENT DOCUMENTS

| CN | 101175635 A | 5/2008 |
| JP | 2003-188576 A | 7/2003 |

(Continued)

OTHER PUBLICATIONS

Extended European Search Report issued in corresponding European Application No. 16796497.2 dated Oct. 12, 2017 (9 pages).
(Continued)

*Primary Examiner* — Timothy J Thompson
*Assistant Examiner* — Charles Pizzuto
(74) *Attorney, Agent, or Firm* — Osha Liang LLP

(57) ABSTRACT

A wiring body includes an adhesive layer, a first conductor layer disposed on the adhesive layer that includes a first terminal portion, a resin layer covering the first conductor layer except for at least the first terminal portion, and a second conductor layer disposed on the resin layer that includes a second terminal portion. The first terminal portion and the second terminal portion are shifted from each other along a thickness direction of the adhesive layer. The first terminal portion protrudes towards a side separated from the adhesive layer in the thickness direction. In a case where the first terminal portion is projected in a direction orthogonal to
(Continued)

the thickness direction, at least a part of a projection portion of the first terminal portion overlaps with the resin layer.

15 Claims, 11 Drawing Sheets

(51) Int. Cl.
  *H05K 3/46* (2006.01)
  *G06F 3/044* (2006.01)
  *H01B 5/14* (2006.01)
  *H01B 13/00* (2006.01)
  *H05K 3/20* (2006.01)
  *H05K 3/38* (2006.01)

(52) U.S. Cl.
  CPC ............... *H05K 1/18* (2013.01); *H05K 3/20* (2013.01); *H05K 3/38* (2013.01); *H05K 3/4682* (2013.01); *G06F 2203/04103* (2013.01); *H05K 2201/10151* (2013.01)

(58) Field of Classification Search
  USPC .......................................... 345/173; 174/250
  See application file for complete search history.

(56) References Cited

U.S. PATENT DOCUMENTS

| | | | |
|---|---|---|---|
| 2011/0157087 A1* | 6/2011 | Kanehira | G06F 3/0414 345/174 |
| 2014/0118637 A1 | 5/2014 | Tanabe et al. | |
| 2015/0047885 A1* | 2/2015 | Chang | G06F 3/044 174/257 |
| 2016/0181592 A1 | 6/2016 | Chung et al. | |
| 2016/0224166 A1* | 8/2016 | Yamazaki | G02F 1/13338 |
| 2017/0177121 A1* | 6/2017 | Ishii | G06F 3/044 |

FOREIGN PATENT DOCUMENTS

| | | |
|---|---|---|
| JP | 2010-244514 A | 10/2010 |
| JP | 2014-013708 A | 1/2014 |
| JP | 2014-191717 A | 10/2014 |
| JP | 2014-216175 A | 11/2014 |
| TW | 200301488 A | 7/2003 |
| WO | 2014/129852 A1 | 8/2014 |
| WO | 2014/185755 A1 | 11/2014 |

OTHER PUBLICATIONS

Japanese Office Action in corresponding Application No. 2015-103092 dated Apr. 12, 2016 (3 pages).
Office Action issued in corresponding Chinese Patent Application No. 201680002504.4 dated Jan. 23, 2019, with translation (24 pages).
European Office Action issued in European Application No. 16796497.2; dated Feb. 4, 2019 (6 pages).

* cited by examiner

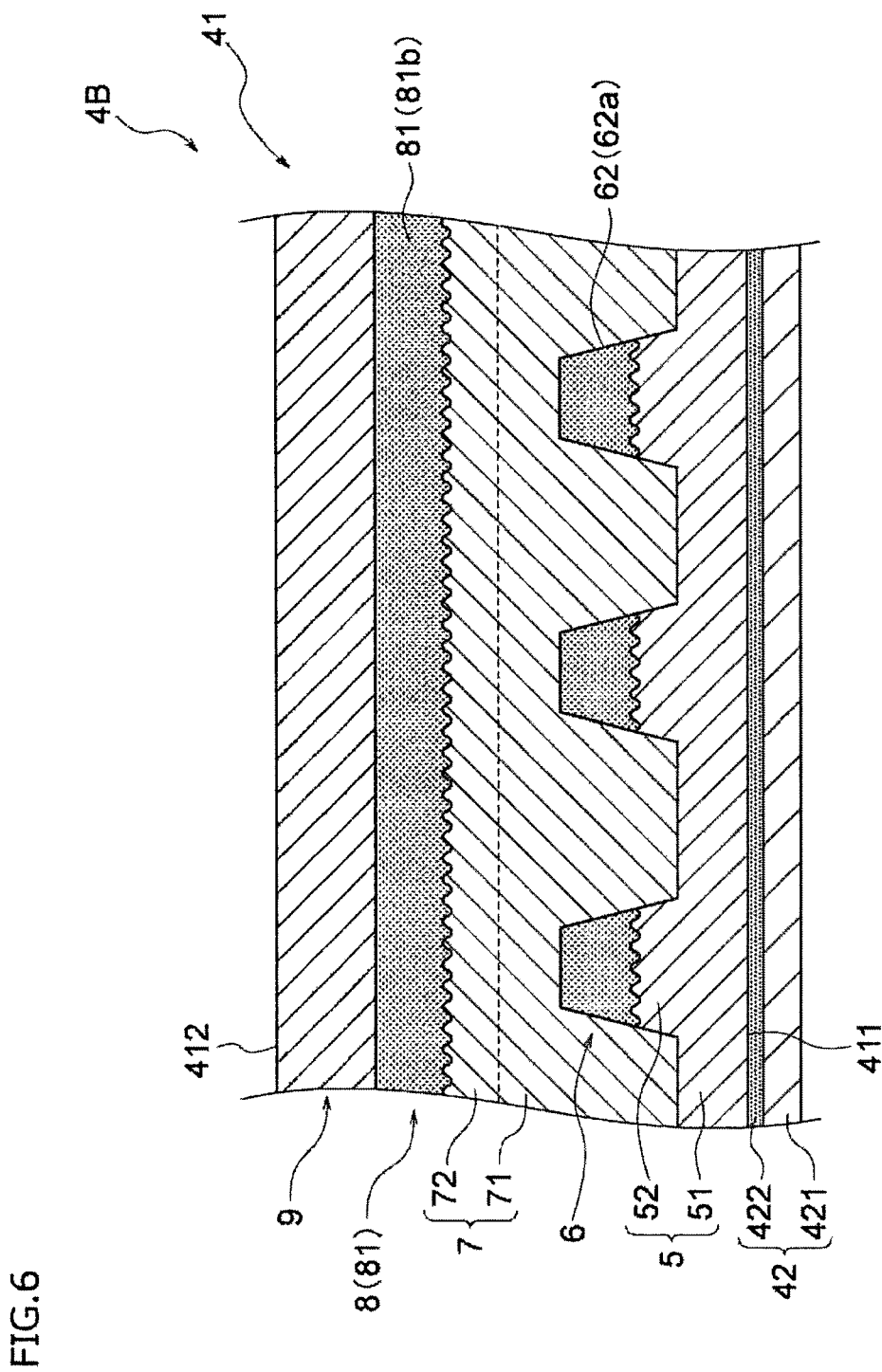

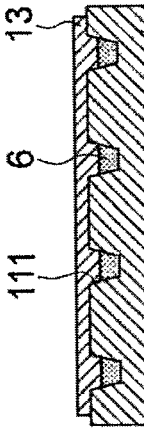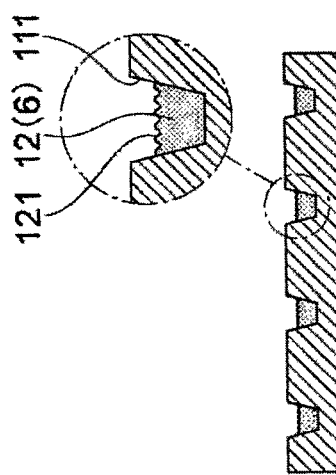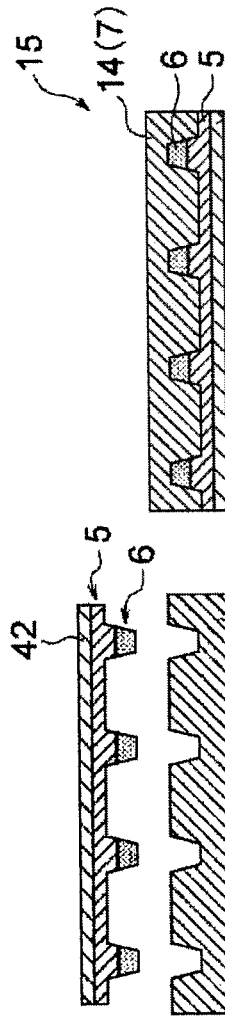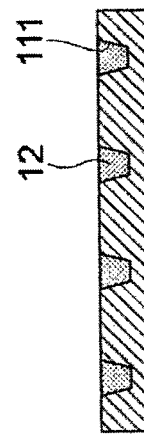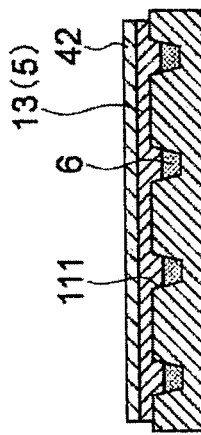

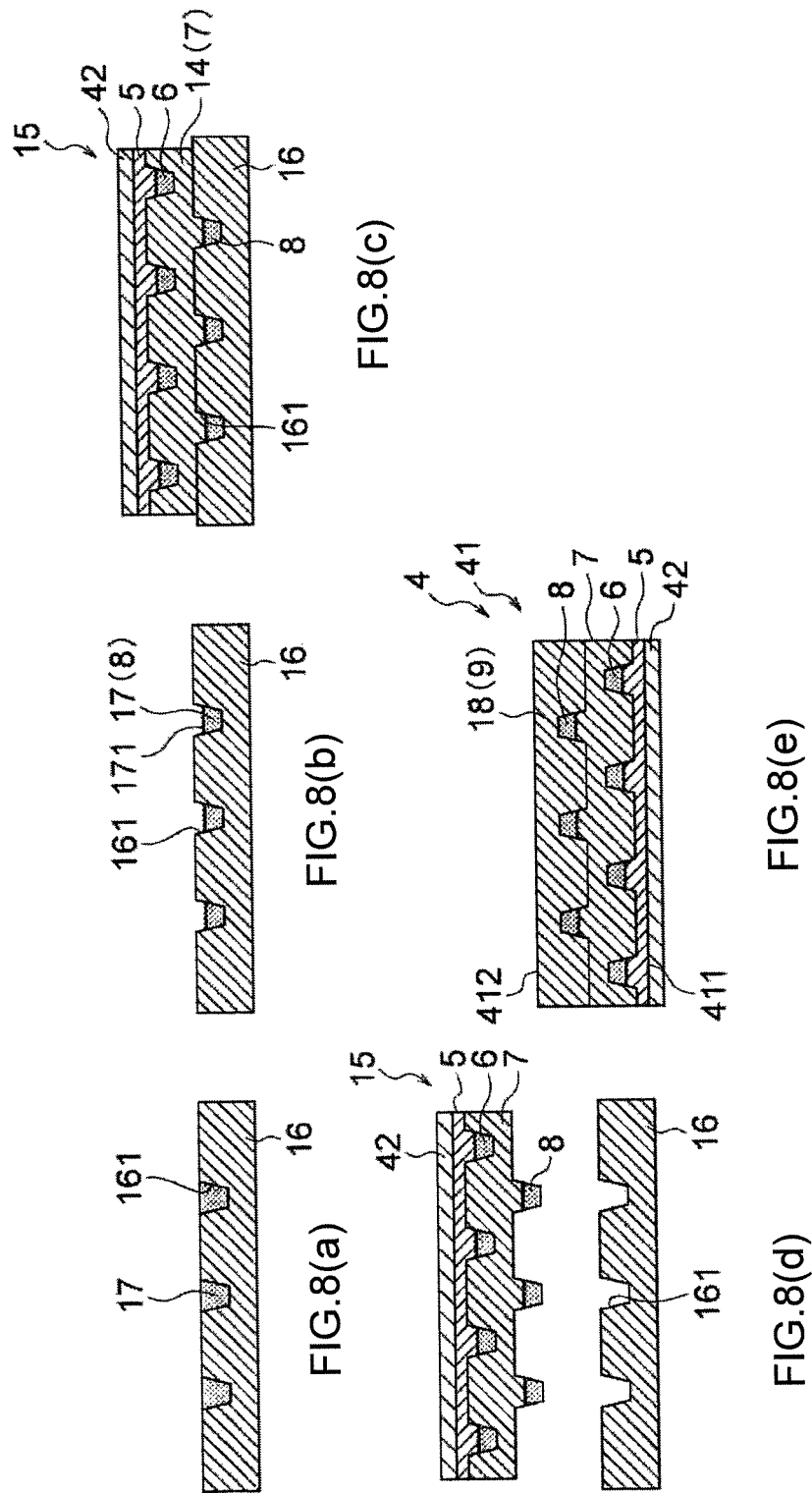

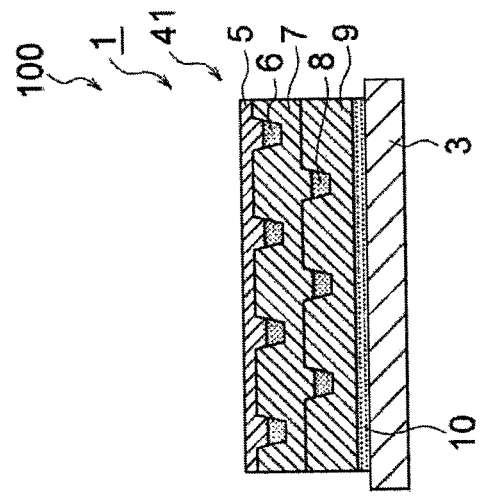
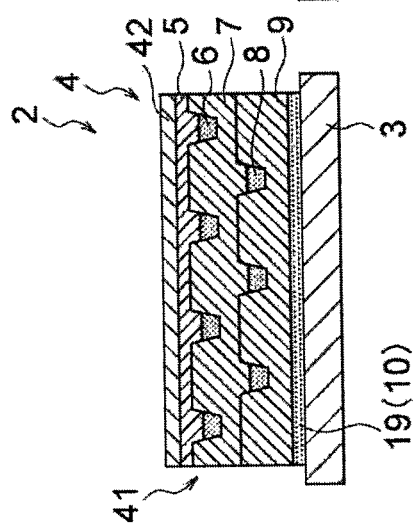
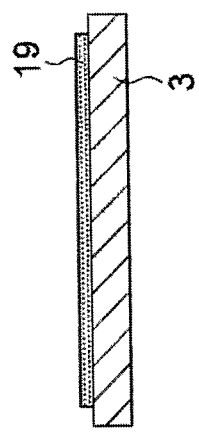
FIG.9(c)
FIG.9(b)
FIG.9(a)

METHOD FOR PRODUCING CONDUCTOR-LAYER-PROVIDED STRUCTURE, SUBSTRATE-PROVIDED WIRING BODY, SUBSTRATE-PROVIDED STRUCTURE, AND TOUCH SENSOR

TECHNICAL FIELD

The present invention relates to a method for producing a conductor-layer-provided structure, a substrate-provided wiring body, a substrate-provided structure, and a touch sensor.

In designated nations where incorporation of documents by reference is accepted, the contents disclosed in Japanese Patent Application No. 2015-103092, filed on May 20, 2015 in Japan is incorporated by reference into this specification, and is regarded as a part of disclosure of this specification.

BACKGROUND ART

There has been a known information processor in which a top plate and a sensor device are bonded and fixed to each other by an adhesive layer (for example, see Patent Document 1).

CITATION LIST

Patent Document

Patent Document 1: JP 2010-244514 A

SUMMARY OF THE INVENTION

Problem to be Solved by the Invention

In the above-mentioned technology, a main surface of the sensor device on an opposite side from a main surface facing the top plate is exposed to the outside. Thus, there is a problem that the main surface of the sensor device may be damaged in a producing process, and visibility may deteriorate.

Problems to be solved by the present invention include providing a method for producing a conductor-layer-provided structure, a substrate-provided wiring body, a substrate-provided structure, and a touch sensor capable of suppressing deterioration of visibility.

Means for Solving Problem

[1] A method for producing a conductor-layer-provided structure (a structure with a conductor layer) according to the invention includes a first process of preparing a substrate-provided wiring body (a wiring body with a substrate) including a wiring body including first resin layer and a conductor layer provided on the first resin layer, and a first substrate provided on one main surface of the wiring body so as to directly come into contact with the first resin layer, a second process of bonding the other main surface of the wiring body to a support, and a third process of peeling off the first substrate from the wiring body, and the following Formula (1) is satisfied:

$$0.01 \text{ N/cm} \leq N_1 \leq 1 \text{ N/cm} \quad (1)$$

in the Formula (1), $N_1$ denotes peel strength between the first resin layer and the first substrate.

[2] In the above invention, the second process may include interposing an adhesive layer between the wiring body and the support.

[3] In the above invention, the second process may include bonding the support to the wiring body through the adhesive layer after the adhesive layer is formed on the support.

[4] In the above invention, the wiring body may further include a second resin layer provided on the first resin layer to cover the conductor layer.

[5] In the above invention, the substrate-provided wiring body may further include a second substrate provided on the other main surface of the wiring body, and the second process may include peeling off the second substrate from the substrate-provided wiring body, and bonding the other main surface of the wiring body to the support after the second substrate is peeled off from the substrate-provided wiring body.

[6] In the above invention, the following Formula (2) may be satisfied:

$$H_2 > H_1 \quad (2)$$

in the Formula (2), $H_1$ denotes a height of the first substrate, and $H_2$ denotes a height of the second substrate.

[7] In the above invention, the conductor layer may include a conductor wire, the conductor wire may include a first surface positioned on a side of the first resin layer, a second surface on an opposite side from the first surface, and two side surfaces inclined such that the side surfaces approach each other as being separated from the first resin layer in a cross section of the conductor wire in a short direction, and surface roughness of the first surface may be rougher than surface roughness of the second surface.

[8] A substrate-provided wiring body (a wiring body with a substrate) according to the invention includes a wiring body including a first resin layer and a conductor layer provided on the first resin layer, and a first substrate provided on one main surface of the wiring body so as to directly come into contact with the first resin layer, and the following Formula (3) is satisfied:

$$0.01 \text{ N/cm} \leq N_1 \leq 1 \text{ N/cm} \quad (3)$$

in the Formula (3), $N_1$ denotes peel strength between the first resin layer and the first substrate.

[9] In the above invention, the wiring body may further include a second resin layer covering a conductor layer farthest away from one main surface of the wiring body among conductor layers included in the wiring body.

[10] In the above invention, the substrate-provided wiring body may further include a second substrate provided on the second resin layer, and the following Formula (4) may be satisfied:

$$0.01 \text{ N/cm} \leq N_2 \leq 1 \text{ N/cm} \quad (4)$$

in the Formula (4), $N_2$ denotes peel strength between the second resin layer and the second substrate.

[11] In the above invention, the following Formula (5) may be satisfied:

$$N_2 < N_1 \quad (5)$$

In the Formula (5), $N_1$ denotes peel strength between the first resin layer and the first substrate, and $N_2$ denotes peel strength between the second resin layer and the second substrate.

[12] In the above invention, the following Formula (6) may be satisfied:

$$H_2 > H_1 \quad (6)$$

In the Formula (6), $H_1$ denotes a height of the first substrate, and $H_2$ denotes a height of the second substrate.

[13] In the above invention, the conductor layer may include a conductor wire, the conductor wire may include a first surface positioned on a side of the first resin layer, a second surface on an opposite side from the first surface, and two side surfaces inclined such that the side surfaces approach each other as being separated from the first resin layer in a cross section of the conductor wire in a short direction, and surface roughness of the first surface may be rougher than surface roughness of the second surface.

[14] A substrate-provided structure (a structure with a substrate) according to the invention includes the above-described substrate-provided wiring body, and a support provided on the other main surface of the wiring body.

[15] In the above invention, the substrate-provided structure may further include an adhesive layer interposed between the wiring body and the support to bond the wiring body and the support to each other.

[16] A touch sensor according to the invention includes the substrate-provided structure.

Effect of the Invention

According to the invention, a wiring body may be inhibited from being damaged in a producing process, and visibility of the wiring body may be inhibited from deteriorating by providing a first substrate that protects one main surface of the wiring body.

BRIEF DESCRIPTION OF DRAWINGS

FIG. 6 is a cross-sectional view illustrating a first modified example of a substrate-provided wiring body according to an embodiment of the invention.

FIG. 7(a) to FIG. 7(f) are cross-sectional views illustrating a method (Method 1) for producing a conductor-layer-provided structure according to an embodiment of the invention.

FIG. 8(a) to FIG. 8(e) are cross-sectional views illustrating a method (Method 2) for producing the conductor-layer-provided structure according to an embodiment of the invention.

FIGS. 9(a) to 9(c) are cross-sectional views illustrating a method (Method 3) for producing the conductor-layer-provided structure according to an embodiment of the invention.

MODE(S) FOR CARRYING OUT THE INVENTION

Hereinafter, an embodiment of the invention will be described based on drawings.

Figure 1:
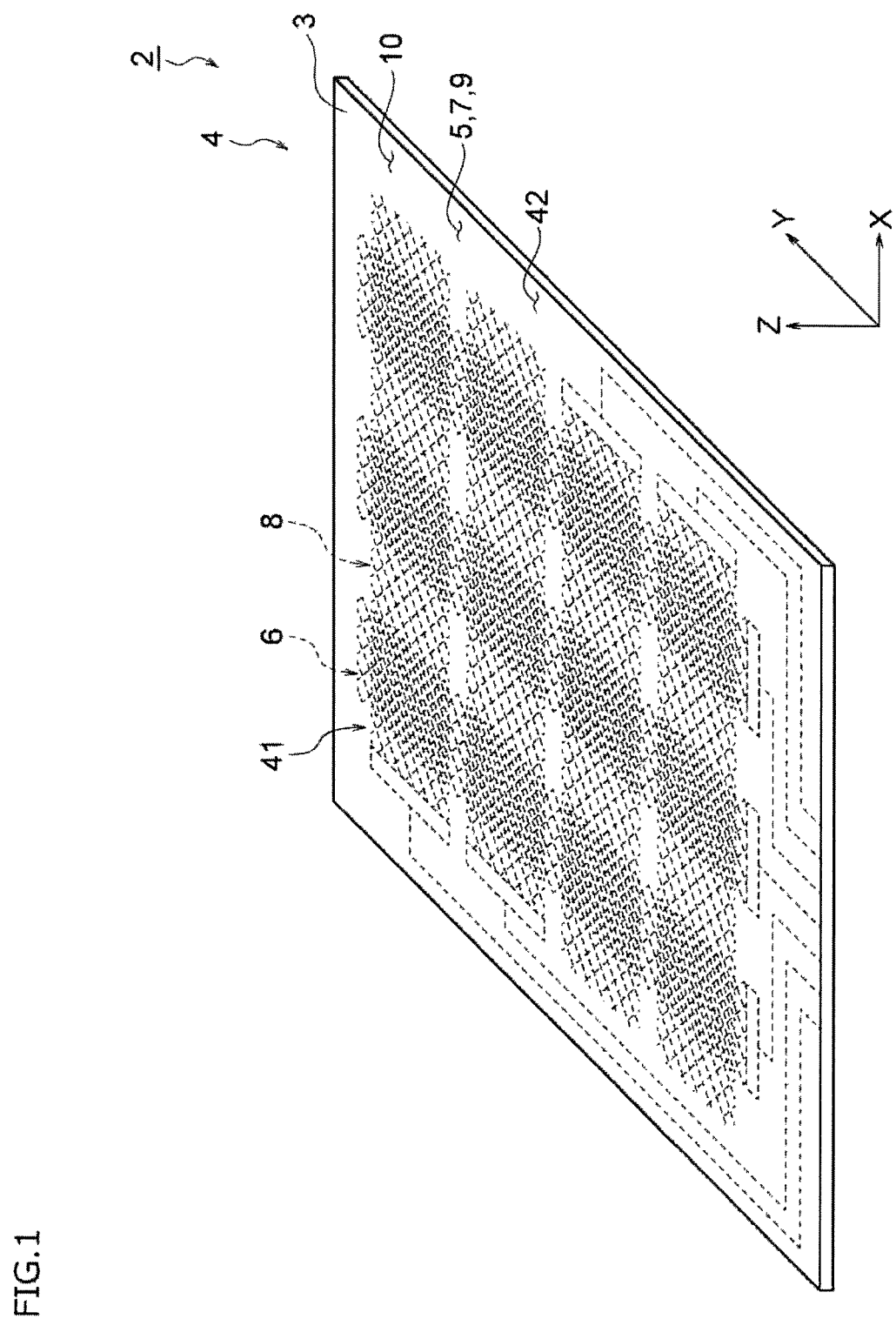
FIG. 1 is a perspective view illustrating a substrate-provided structure according to an embodiment of the invention.
Figure 2:
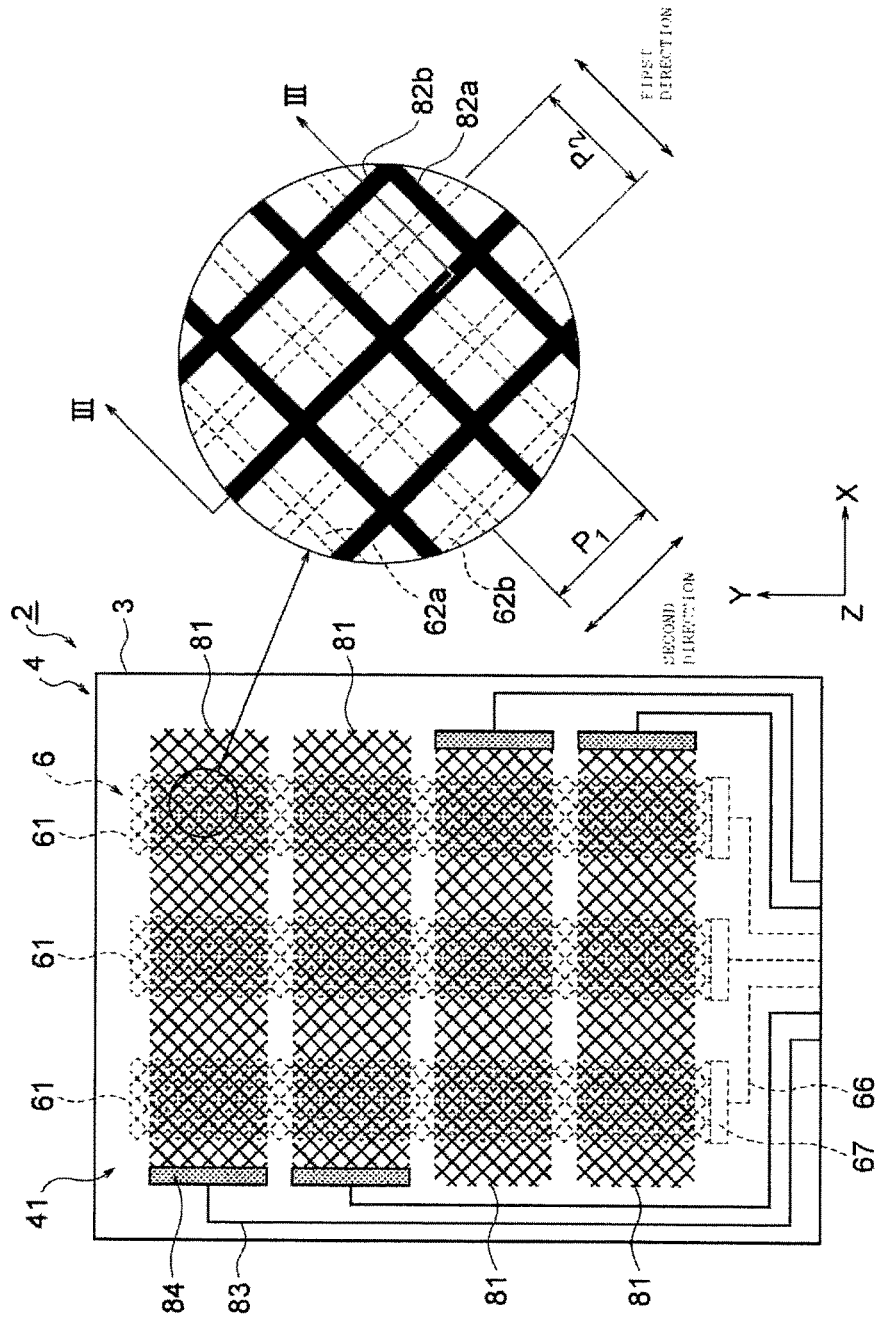
FIG. 2 is a perspective plan view illustrating the substrate-provided structure according to the embodiment of the invention.
Figure 3:
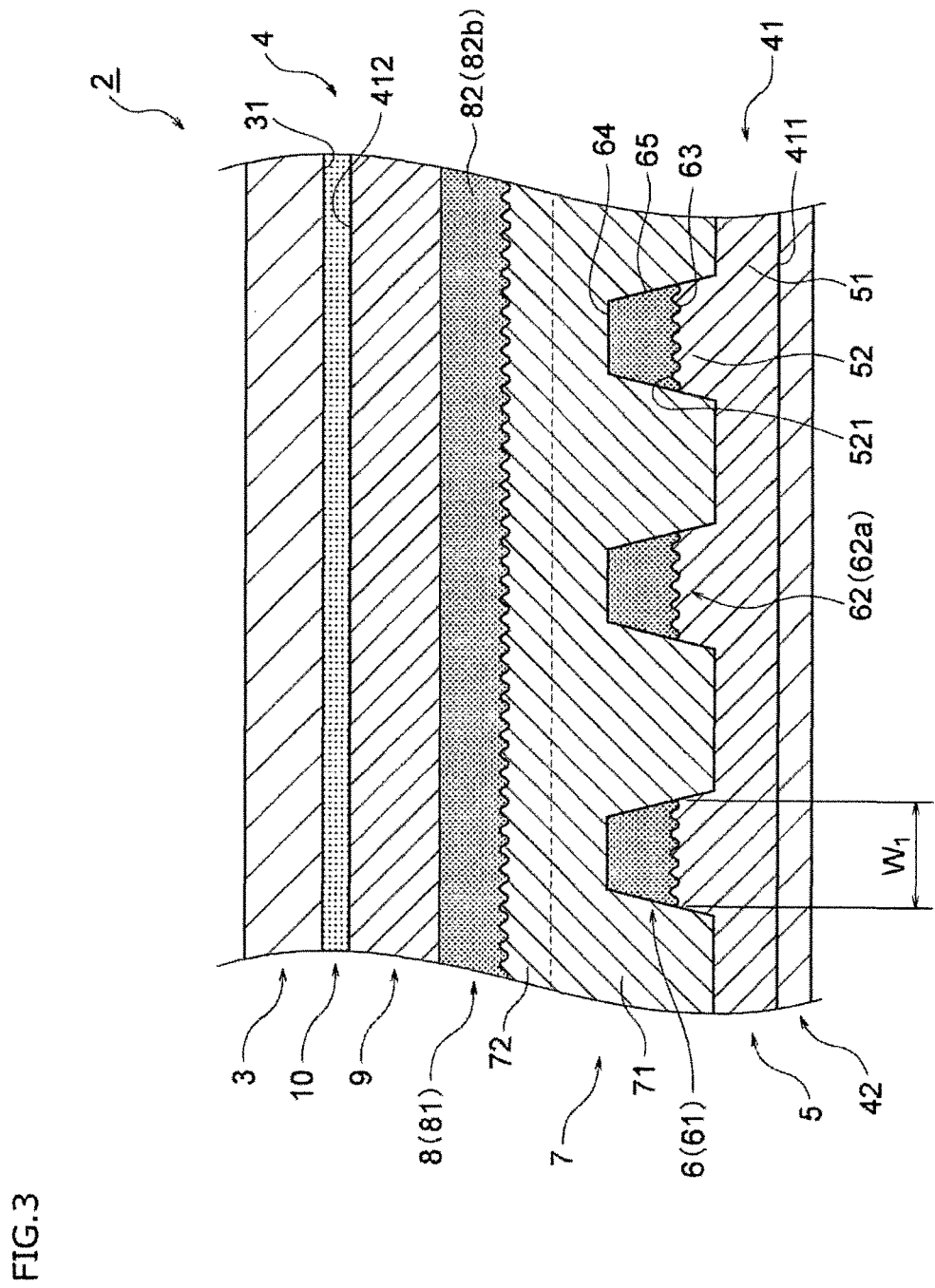
FIG. 3 is a cross-sectional view of the substrate-provided structure taken along III-III line of FIG. 2.
Figure 4:
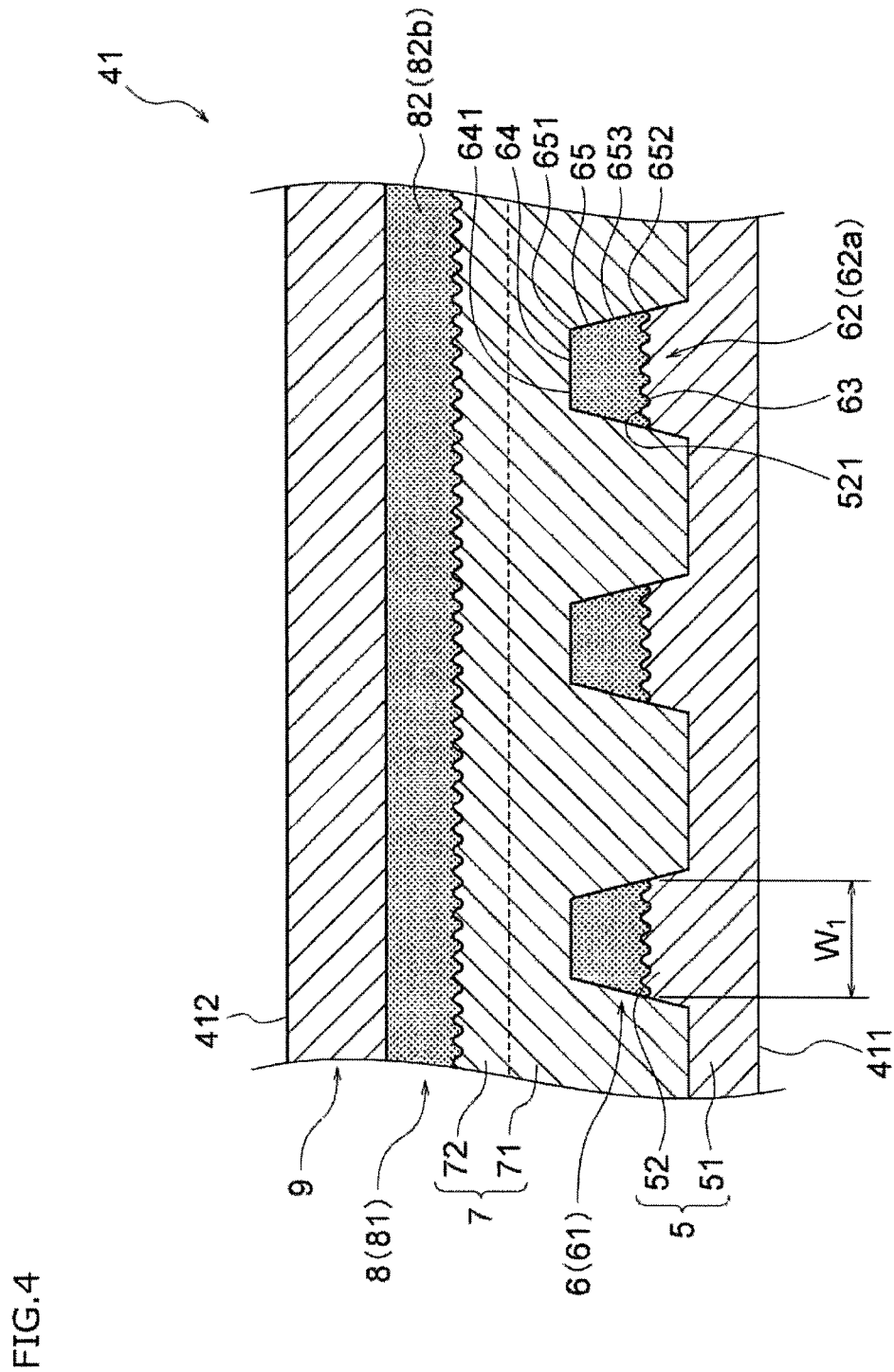
FIG. 4 is a cross-sectional view illustrating a wiring body according to an embodiment of the invention.
Figure 5:
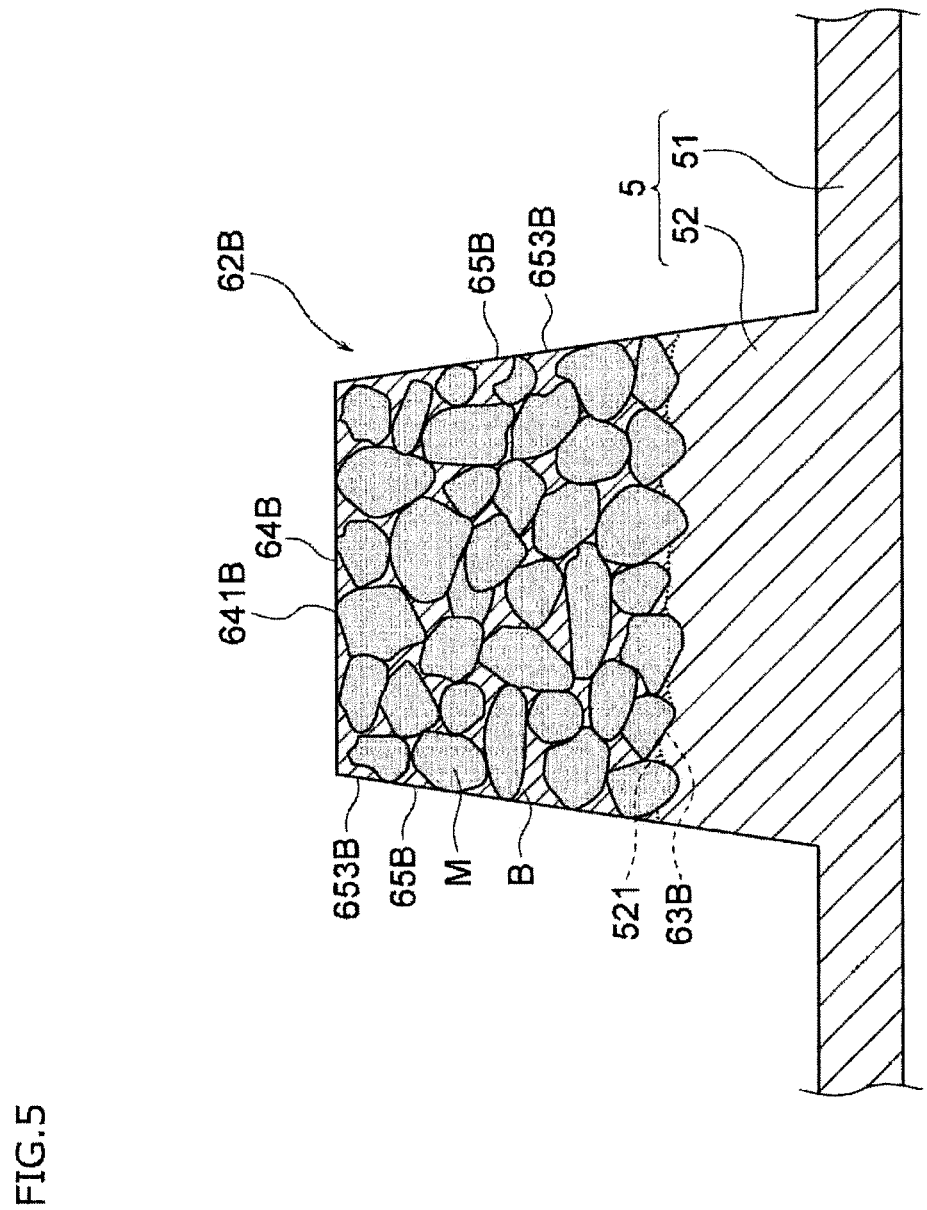
FIG. 5 is a cross-sectional view for description of a first conductor wire according to an embodiment of the invention.

FIG. 1 is a perspective view illustrating a substrate-provided structure according to an embodiment of the invention. FIG. 2 is a perspective plan view illustrating the substrate-provided structure according to the embodiment of the invention. FIG. 3 is a cross-sectional view of the substrate-provided structure taken along III-III line of FIG. 2. FIG. 4 is a cross-sectional view illustrating a wiring body according to an embodiment of the invention. FIG. 5 is a cross-sectional view for description of a first conductor wire according to an embodiment of the invention. FIG. 6 is a cross-sectional view illustrating a first modified example of a substrate-provided wiring body according to an embodiment of the invention. In FIG. 2, a second conductor layer 8 is indicated by a solid line, and a first conductor layer 6 is indicated by a broken line to facilitate understanding of a configuration of the substrate-provided structure. In addition, in FIG. 5, only a first resin layer 5 and a first conductor layer 6 in a configuration of a wiring body 41 are illustrated to describe a configuration of the first conductor wire in an easily understood manner.

A conductor-layer-provided structure 1 (see FIG. 9(c)) of the present embodiment is a structure in which the wiring body 41 having first and second conductor layers 6 and 8 (described below) is provided on cover glass 3 through an adhesive layer 10. The conductor-layer-provided structure 1 is not particularly restricted. For example, the conductor-layer-provided structure 1 is used by being incorporated in a touch sensor 100 (see FIG. 9(c)) which is a touch input device such as a touch panel or a touch pad corresponding to a capacitive sensing method, etc. The "conductor-layer-provided structure 1" in the present embodiment corresponds to an example of a "conductor-layer-provided structure" in the invention.

A display device (not illustrated) such as a liquid crystal display, an organic electro luminescence (EL) display, electronic paper, etc. is incorporated in the touch sensor 100. In the touch sensor 100, one of two electrodes disposed to face each other is used as a detection electrode, the other one is used as a driving electrode, and a predetermined voltage is periodically applied between the two electrodes from an external circuit (not illustrated). In addition, for example, when a finger of an operator (external conductor) approaches the touch sensor 100 at the time of performing an operation by the operator according to an image displayed on the display device, a capacitor (electrostatic capacity) is formed between the external conductor and the touch sensor 100, and an electrical state between the two electrodes changes. The touch sensor 100 may detect an operation position of the operator based on an electrical change between the two electrodes.

The conductor-layer-provided structure 1 of the present embodiment is produced using a substrate-provided structure 2. Hereinafter, the substrate-provided structure 2 will be described in detail. A method for producing the conductor-layer-provided structure will be described below in detail.

As illustrated in FIG. 1 to FIG. 3, the substrate-provided structure 2 includes the cover glass 3, a substrate-provided wiring body 4, and the adhesive layer 10. The "substrate-provided structure 2" in the present embodiment corresponds to an example of a "substrate-provided structure" in the invention.

As illustrated in FIG. 1, the cover glass 3 is a protective layer that protects the wiring body 41, etc. from the outside. The cover glass 3 is not particularly restricted. However, for example, the cover glass 3 may include soda-lime glass, borosilicate glass, etc.

A transparent resin such as polymethyl methacrylate (PMMA), etc. may be used instead of the cover glass 3 as the protective layer that protects the wiring body 41, etc. from the outside. The "cover glass 3" in the present embodiment corresponds to an example of a "support" in the invention.

As illustrated in FIG. 3, the substrate-provided wiring body 4 is formed on a main surface 31 of the cover glass 3 through the adhesive layer 10 and supported by the cover glass 3. The substrate-provided wiring body 4 includes the wiring body 41 and a support substrate 42. As illustrated in FIG. 4, the wiring body 41 includes the first resin layer 5, the first conductor layer 6, a second resin layer 7, the second conductor layer 8, and a third resin layer 9.

In the present embodiment, the second conductor layer 8 has the same configuration as that of the first conductor layer 6. Therefore, in this specification, in the invention below, with regard to the configuration of the second conductor layer 8, a detailed description of the same point as that of the first conductor layer 6 will be omitted, and each difference will be described. The "substrate-provided wiring body 4" in the present embodiment corresponds to an example of a "substrate-provided wiring body" in the invention, and the "wiring body 41" in the present embodiment corresponds to an example of a "wiring body" in the invention.

Examples of a material included in the first resin layer 5 may include a UV-curing resin, a thermosetting resin, or a thermoplastic resin such as epoxy resin, acrylic resin, polyester resin, urethane resin, vinyl resin, silicone resin, phenol resin, polyimide resin, etc.

As illustrated in FIG. 4, the first resin layer 5 includes a flat portion 51 provided at a substantially constant thickness and a support portion 52 formed on the flat portion 51. The thickness of the flat portion 51 is preferably within a range of 5 μm to 100 μm. The support portion 52 is formed between the flat portion 51 and the first conductor layer 6, and formed to protrude in a direction away from the flat portion 51 (upward direction in FIG. 3).

The first resin layer 5 comes into contact with the first conductor layer 6 on an upper surface (a surface on an upper side in FIG. 4) of the support portion 52. The support portion 52 has two straight line-shaped side surfaces inclined to approach each other as being separated from the flat portion 51 in a section view in a short direction. The section view in the short direction mentioned herein refers to a cross section along a short direction of a first conductor wire 62 (described below) included in a first net-shaped electrode layer 61 coming into contact with the support portion 52.

As illustrated in FIG. 4, a resin layer contact surface 521 has a concave-convex shape complementary to a conductor layer contact surface 63 having a concave-convex shape. Although not particularly illustrated, in a cross section in an extending direction of the first conductor wire 62 (described below) included in the first net-shaped electrode layer 61, the resin layer contact surface 521 and the conductor layer contact surface 63 have concave-convex shapes complementary to each other. In FIG. 4, the concave-convex shapes of the resin layer contact surface 521 and the conductor layer contact surface 63 are exaggeratingly illustrated to describe the wiring body 41 in the present embodiment in an easily understood manner. The "first resin layer 5" in the present embodiment corresponds to an example of a "first resin layer" in the invention.

As illustrated in FIG. 2, the first conductor layer 6 includes the first net-shaped electrode layer 61 and a lead-out wire 66. As illustrated in FIG. 2, the first net-shaped electrode layer 61 corresponds to a plurality of (three in the present embodiment) detection electrodes of the touch input device, each of which extends in a Y direction, is stacked on the support portion 52 of the first resin layer 5, and is formed to protrude in a +Z direction (see FIG. 4). The "first conductor layer 6" in the present embodiment corresponds to an example of a "conductor layer" in the invention.

A second net-shaped electrode layer 81 of the second conductor layer 8 corresponds to a plurality of (four in the present embodiment) detection electrodes of the touch input device, each of which extends in an X direction, disposed to overlap the first net-shaped electrode layer 61 in a planar view.

The first net-shaped electrode layer 61 includes conductive powder (conductive particle) and a binder resin. In the first net-shaped electrode layer 61, the conductive powder is substantially uniformly dispersed in the binder resin, and conductivity is assigned to the first net-shaped electrode layer 61 when conductive powders come into contact with each other.

Examples of the conductive powder contained in the first net-shaped electrode layer 61 may include a metal material such as silver, copper, nickel, tin, bismuth, zinc, indium, palladium, etc., or a carbon-based material such as graphite, carbon black (furnace black, acetylene black, Ketjen black), carbon nanotube, carbon nanofiber, etc. In addition to the conductive powder, metal salt corresponding to salt of the above-mentioned metal may be used.

For example, conductive powder having a particle diameter $\varphi$ of 0.5 μm or more and 2 μm or less (0.5 μm≤$\varphi$≤c. 2 μm) depending on a width of the first conductor wire 62 included in the first net-shaped electrode layer 61 may be used as the conductive powder contained in the first net-shaped electrode layer 61. It is preferable to use conductive powder having an average particle diameter $\varphi$ which is half or less the width of the first conductor wire 62 included in the first net-shaped electrode layer 62 in terms of stabilizing electrical resistivity in the first net-shaped electrode layer 62. In addition, it is preferable to use a particle, whose specific surface area measured by a BET method is 20 $m^2$/g or more, as the conductive powder.

When relatively small electrical resistivity of a certain value or less is required for the first net-shaped electrode layer 61, the metal material is preferably used as the conductive powder. When relatively large electrical resistance value of a certain value or more is allowed for the first net-shaped electrode layer 61, the carbon-based material may be used as the conductive powder. Using the carbon-based material as the conductive powder is preferable in terms of improving haze or total light reflectance of a mesh film.

In the present embodiment, optical transparency is assigned to the first net-shaped electrode layer 61 by forming the electrode layer in a net shape. In this case, it is possible to use a metal material such as silver, copper, or nickel, or opaque conductive powder excellent in conductivity such as the above-mentioned carbon-based material (an opaque metal material and an opaque carbon-based material) as the conductive powder contained in the first net-shaped electrode layer 61.

Examples of the binder resin contained in the first net-shaped electrode layer 61 may include acrylic resin, polyester resin, epoxy resin, vinyl resin, urethane resin, phenol resin, polyimide resin, silicone resin, fluoride resin, etc. The binder resin may be omitted from the material included in the first net-shaped electrode layer 61.

The first net-shaped electrode layer 61 is formed by applying and hardening conductive paste. Specific examples of the conductive paste may include conductive paste configured by mixing conductive powder, binder resin, water, or a solvent and various addition agents. Examples of the solvent contained in the conductive paste may include α-terpineol, butyl carbitol acetate, butyl carbitol, 1-decanol, butyl cellosolve, diethylene glycol monoethyl ether acetate, tetradecane, etc.

As illustrated in FIG. 2, the first net-shaped electrode layer 61 of the present embodiment is configured by allowing first conductor wires 62a and 62b having conductivity to intersect each other, and has a shape in which rectangle nets is repeatedly arranged as a whole. The "first conductor wires 62a and 62b" in the present embodiment correspond to an example of a "conductor wire" in the invention. In description below, the "first conductor wire 62a" and the "first conductor wire 62b" are collectively referred to as the "first conductor wire 62" as necessary.

As illustrated in FIG. 4, an external shape of the first conductor wire 62 of the present embodiment includes a conductor layer contact surface 63, a conductor layer top surface 64, and two conductor layer side surfaces 65 and 65. The conductor layer contact surface 63 is a surface coming into contact with the first resin layer 5. The first net-shaped electrode layer 61 of the present embodiment is supported by the first resin layer 5. In this case, the conductor layer contact surface 63 is a surface positioned on the first resin layer 5 side of the conductor layer top surface 64. In addition, the conductor layer contact surface 63 is a surface having a concave-convex shape that includes fine concave and convex portions in a cross section in a short direction. The concave-convex shape of the conductor layer contact surface 63 is formed based on surface roughness of the conductor layer contact surface 63. The surface roughness of the conductor layer contact surface 63 will be described below in detail.

Meanwhile, the conductor layer top surface 64 is a surface on an opposite side facing the conductor layer contact surface 63. The conductor layer top surface 64 has a top surface flat portion 641 having a straight line shape. The conductor layer top surface 64 is a surface substantially parallel to a lower surface (a surface on a lower side in FIG. 4) of the first resin layer 5. In a cross section of the first conductor wire 62 in a short direction, a width of the top surface flat portion 641 is half or more a width of the conductor layer top surface 64. In the present embodiment, substantially the whole of the conductor layer top surface 64 corresponds to the top surface flat portion 641. Flatness of the top surface flat portion 641 is 0.5 μm or less. The flatness may be defined by the JIS method (JIS B0621 (1984)).

The flatness of the top surface flat portion 641 is obtained using a non-contact measurement scheme using laser light. Specifically, a measuring object is irradiated with belt-shaped laser light, and an image of reflected light thereof is formed on an image pick-up device (for example, a two-dimensional (2D) CMOS) to measure the flatness. A scheme (maximum deflection-type flatness) is used as a scheme of calculating the flatness to set planes passing through three points separated from one another as much as possible on a target plane, and calculate a maximum value of deviations thereof as the flatness. A scheme of measuring or calculating the flatness is not particularly restricted to the above-described schemes. For example, a scheme of measuring the flatness may correspond to a contact-type measurement scheme using a dial gauge, etc. In addition, a scheme (maximum tilt-type flatness) may be used as a scheme of calculating the flatness to calculate a value of a gap, which is generated when a target plane is interposed between parallel planes, as the flatness.

As illustrated in FIG. 4, the conductor layer side surface 65 is interposed between the conductor layer contact surface 63 and the conductor layer top surface 64. The conductor layer side surface 65 is connected to the conductor layer top surface 64 at one end portion 651, and connected to the conductor layer contact surface 63 at the other end portion 652.

The conductor layer side surfaces 65 and 65 correspond to straight line-shaped surfaces inclined such that the conductor layer side surface 65 and 65 approach each other as being separated from the first resin layer 5 in the section view in the short direction. The first conductor wire 62 has a tapered shape in which a width narrows as being separated from the first resin layer 5 in a section view of the first conductor wire 62 in a short direction. In addition, in the present embodiment, the conductor layer side surfaces 65 and 65 are continued to the support portion 52 of the first resin layer 5 with which the conductor layer side surfaces 65 and 65 come into contact in the section view in the short direction.

The conductor layer side surface 65 includes a side surface flat portion 653 in a cross section of the first conductor wire 62 in a width direction. The side surface flat portion 653 is a straight line-shaped portion present on the conductor layer side surface 65 in the section view of the first conductor wire 62 in the short direction. Flatness of the side surface flat portion 653 is 0.5 μm or less. The conductor layer side surface 65 of the present embodiment is a surface extending on a virtual straight line (not illustrated) passing through the both ends 651 and 652 thereof. Substantially the whole of the conductor layer side surface 65 corresponds to the side surface flat portion 653.

A shape of the conductor layer side surface 65 is not particularly restricted to the above-described shape. For example, the conductor layer side surface 65 may have a circular arc shape protruding outward in the section view of the first conductor wire 62 in the short direction. In this case, the conductor layer side surface 65 is present on the outside of the virtual straight line passing through the both ends 651 and 652 thereof. In this way, the conductor layer side surface 65 preferably has a shape which is not present on the inside of the virtual straight line passing through the both ends thereof in the section view of the fine wire in the short direction. For example, the shape of the side surface preferably does not correspond to a circular arc shape in which the side surface is recessed inward (that is, a shape in which a hem of the conductor wire widens) when the width of the first conductor wire gradually increases as approaching the first resin layer in the section view of the first conductor wire in the short direction.

Surface roughness of the conductor layer contact surface 63 of the first net-shaped electrode layer 61 in the present embodiment is preferably relatively rougher than surface roughness of the conductor layer top surface 64 in terms of strongly fixing the first net-shaped electrode layer 61 and the first resin layer 5 to each other. In the present embodiment, since the conductor layer top surface 64 includes the top surface flat portion 641, the above-described relative relation with regard to surface roughness (a relation in which the surface roughness of the conductor layer top surface 64 is relatively larger than the surface roughness of the conductor layer contact surface 63) is satisfied. Specifically, it is preferable that the surface roughness Ra of the conductor layer contact surface 63 is within a range of 0.1 µm to 3.0 µm, and the surface roughness Ra of the conductor layer top surface 64 is within a range of 0.001 µm to 1.0 µm. The surface roughness Ra of the conductor layer contact surface 63 is more preferably within a range of 0.1 µm to 0.5 µm, and the surface roughness Ra of the conductor layer top surface 64 is more preferably within a range of 0.001 µm to 0.3 µm. In addition, a relation of the surface roughness of the conductor layer top surface 64 with respect to the surface roughness of the conductor layer contact surface 63 preferably corresponds to 0.01 or more and less than 1, and more preferably corresponds to 0.1 or more and less than 1. In addition, the surface roughness of the conductor layer top surface 64 is preferably ⅕ or less the width (maximum width) of the first conductor wire 62. Such surface roughness may be measured by the JIS method (JIS B0601 (revised on Mar. 21, 2013)). The surface roughness of the conductor layer contact surface 63 or the surface roughness of the conductor layer top surface 64 may be measured along the width direction of the first conductor wire 62 or along the extending direction of the first conductor wire 62.

Incidentally, as described in the JIS method (JIS B0601 (revised on Mar. 21, 2013)), the "surface roughness Ra" herein refers to an "arithmetic average roughness Ra". This "arithmetic average roughness Ra" refers to a roughness parameter obtained by excluding a long wavelength component (waviness component) from a profile curve. The waviness component is separated from the profile curve based on a measurement condition (for example, dimensions of an object, etc.) necessary to obtain a form.

In the present embodiment, the conductor layer side surface 65 includes the side surface flat portion 653. For this reason, similarly to the conductor layer top surface 64, the surface roughness of the conductor layer contact surface 63 is relatively larger than surface roughness of the conductor layer side surface 65. While the surface roughness Ra of the conductor layer contact surface 63 is within a range of 0.1 µm to 3 µm, the surface roughness Ra of the conductor layer side surface 65 is preferably within a range of 0.001 µm to 1.0 µm, and more preferably within a range of 0.001 µm to 0.3 µm. The surface roughness of the conductor layer side surface 65 may be measured along the width direction of the first conductor wire 62 or along the extending direction of the first conductor wire 62.

When a relative relation between the surface roughness of the conductor layer contact surface 63 and surface roughness of surfaces except for the conductor layer contact surface 63 (the conductor layer top surface 64 and the conductor layer side surface 65) satisfies the above-described relation, a diffuse reflectance on a side of the surfaces except for the conductor layer contact surface 63 is smaller than a diffuse reflectance on a side of the conductor layer contact surface 63. In this case, a ratio of the diffuse reflectance on the side of the surfaces except for the conductor layer contact surface 63 to the diffuse reflectance on the side of the conductor layer contact surface 63 is preferably 0.1 or more and less than 1, and more preferably 0.3 or more and less than 1.

A description will be given of an example of a shape of the fine wire of the first conductor wire having the above-described relative relation between the surface roughness of the contact surface and the surface roughness of the surfaces except for the contact surface with reference to FIG. 5. On a conductor layer contact surface 63B of a net-shaped electrode layer 6B including conductive powder M and binder resin B, a portion of the conductive powder M protrudes from the binder resin B in a section view of a first conductor wire 62B in a short direction. In the way, the conductor layer contact surface 63B has a concave-convex shape. Meanwhile, on a conductor layer top surface 64B and a conductor layer side surface 65B, the binder resin B penetrates between conductive powders M in the section view of a first conductor wire 62B in the short direction. The conductor layer top surface 64B and the conductor layer side surface 65B are dotted with slightly exposed portions of the conductive powders M. However, the binder resin B covers the conductive powders M. In this way, a top surface flat portion 641B having a straight line shape is included in the conductor layer top surface 64B, and a side surface flat portion 653B having a straight line shape is included in the conductor layer side surface 65B. In this case, surface roughness of the conductor layer contact surface 63B is relatively larger than surface roughness of the conductor layer top surface 64B and relatively larger than surface roughness of the conductor layer side surface 65B. When the binder resin B covers the conductive powders M on the conductor layer side surface 65B, electric insulation between adjacent first conductor wires 62B is improved, and occurrence of migration is suppressed.

The "conductor layer contact surface 63" in the present embodiment corresponds to an example of a "first surface" in the invention, the "conductor layer top surface 64" in the present embodiment corresponds to an example of a "second surface" in the invention, and the "conductor layer side surfaces 65 and 65" in the present embodiment corresponds to an example of "side surfaces" in the invention.

Returning to FIG. 2, the first conductor wire 62 is arranged as below in the first net-shaped electrode layer 61 of the present embodiment. In more detail, the first conductor wire 62a extends in a straight line shape along a direction inclined by +45° with respect to the X direction (hereinafter simply referred to as a "first direction"). Further, first conductor wires 62a is arranged at an equal pitch $P_1$ in a direction substantially orthogonal to the first direction (hereinafter simply referred to as a "second direction").

On the other hand, the first conductor wire 62b extends in a straight line shape along the second direction, and first conductor wires 62b is arranged at an equal pitch $P_2$ in the first direction. In addition, when the first conductor wires 62b and 62b are orthogonal to each other, the first net-shaped electrode layer 61 in which a rectangular (rhombus-shaped) net is repeated is formed. In this specification, a pitch refers to a distance between centers.

A configuration of the first net-shaped electrode layer 61 is not particularly restricted to the above-described configuration. For example, in the present embodiment, the pitch $P_1$ of the first conductor wire 62a is substantially equal to the pitch $P_2$ of the first conductor wire 62b ($P_1=P_2$). However, the invention is not particularly restricted thereto, and the pitch $P_1$ of the first conductor wire 62a may be different from the pitch $P_2$ of the first conductor wire 62b ($P_1 \neq P_2$).

In addition, in the present embodiment, the first direction corresponding to an extending direction of the first conductor wire 62a is set to a direction inclined by +45° with respect to the X direction, and the second direction corresponding to an extending direction of the first conductor wire 62b is set to a direction substantially orthogonal to the first direction. However, the extending directions of the first and second directions (that is, an angle of the first direction with respect to an X axis and an angle of the second direction with respect to the X axis) may be arbitrarily set.

In addition, the shape of the net of the first net-shaped electrode layer 61 may correspond to a geometric form. In more detail, the shape of the net may correspond to a triangle such as a regular triangle, an isosceles triangle, a right triangle, etc., and may correspond to a tetragon such as a rectangle, a square, a rhombus, a parallelogram, a trapezoid, etc. Alternatively, the shape of the net may correspond to an n-polygon such as a hexagon, an octagon, a dodecagon, an icosagon, etc., a circle, an ellipse, a star, etc.

In this way, as the first net-shaped electrode layer 61, a geometric form obtained by repeating various figure units may be used as the shape of the net. In the present embodiment, the first conductor wire 62 has the straight line shape. However, the invention is not restricted thereto. For example, the first conductor wire 62 may correspond to a curved shape, a horseshoe shape, a zigzag line shape, etc.

A width $W_1$ (see FIG. 4) of the first conductor wire 62 is preferably within a range of 50 nm to 1,000 µm, more preferably within a range of 500 nm to 150 µm, even more preferably within a range of 1 µm to 10 µm, and further even more preferably within a range of 1 µm to 5 µm. In addition, a height of the first conductor wire 62 is preferably within a range of 50 nm to 3,000 µm, more preferably within a range of 500 nm to 450 µm, and even more preferably within a range of 500 nm to 10 µm.

As illustrated in FIG. 2, the lead-out wire 66 is provided to correspond to the first net-shaped electrode layer 61. In the present embodiment, three lead-out wires 66 are formed for three first net-shaped electrode layers 61. The lead-out wire 66 is drawn out from a −Y direction side of the figure in the first net-shaped electrode layer 61 through a lead-out portion 67. The lead-out wire 66 is integrally formed using the same material as that of the first net-shaped electrode layer 61 described above.

The term "integrally" means that members are not separated from each other and are formed as an integrated structure using the same material (conductive powder, binder resin, etc. having the same particle diameter). At an outer edge of the first net-shaped electrode layer 61, a position at which the lead-out wire 66 is provided is not particularly restricted. In addition, in the present embodiment, the lead-out wire 66 is connected to the first net-shaped electrode layer 61 through the lead-out portion 67. However, the invention is not restricted thereto, and the lead-out wire 66 may be directly connected to the first net-shaped electrode layer 61.

As illustrated in FIG. 4, the second resin layer 7 is formed on the first resin layer 5 to cover the first conductor layer 6. In addition, the second conductor layer 8 is formed on the second resin layer 7. As a result, the second resin layer 7 is interposed between the first conductor layer 6 and the second conductor layer 8 to have a function of ensuring insulation therebetween.

As illustrated in FIG. 4, the second resin layer 7 includes a main portion 71 covering the first conductor layer 6 and a support portion 72 formed on the main portion 71. The support portion 72 is formed between the main portion 71 and the second conductor layer 8, and formed to protrude in a direction away from the first resin layer 5 (upward direction in FIG. 4). Examples of a material included in the second resin layer 7 may include the same material as the material included in the first resin layer 5.

As illustrated in FIG. 4, the third resin layer 9 is formed on the second resin layer 7 to cover the second conductor layer 8 farthest away from one main surface 411 of the wiring body 41 among the conductor layers included in the wiring body 41 (in the present embodiment, the first and second conductor layers 6 and 8). The third resin layer 9 serves as a protective layer that protects the second conductor layer 8 from the outside. In addition, when the second conductor layer 8 is covered with the third resin layer 9, occurrence of scattering, etc. of light on a surface of the wiring body 41 may be suppressed, and deterioration of visibility of the wiring body 41 may be further suppressed.

The third resin layer 9 of the present embodiment is exposed to the outside of the wiring body 41. A main surface, which is one of main surfaces of the third resin layer 9, on an opposite side from a main surface covering the second conductor layer 8 is included in a main surface 412 of the wiring body 41. In this case, in terms of protecting the second conductor layer 8 from the outside by the third resin layer 9, Young's modulus of the material included in the third resin layer 9 is preferably within a range of 0.4 GPa to 4.2 GPa, and more preferably within a range of 2.0 GPa to 4.2 GPa since the second conductor layer may be properly protected when the Young's modulus of the material included in the third resin layer 9 is 0.4 GPa or more, and appropriate flexibility is assigned when the Young's modulus is 4.2 Pa or less. In addition, the Young's modulus of the material included in the third resin layer 9 is preferably relatively larger than Young's modulus of the material included in the first resin layer 5. Examples of the material included in the third resin layer 9 may include the same material as the material included in the first resin layer 5. However, polymethyl methacrylate (PMMA), modified PMMA, etc. is preferably used in terms of further protecting the second conductor layer 8 from the outside by the third resin layer 9. The "third resin layer 9" in the present embodiment corresponds to an example of a "second resin layer" in the invention.

As illustrated in FIG. 3, the support substrate 42 is a film-shaped member, and formed to cover the main surface 411 of the wiring body 41. The support substrate 42 directly comes into contact with the main surface 411 of the wiring body 41, and has a function of protecting the main surface 411 from the outside.

Herein, the touch input device is configured by the conductor-layer-provided structure 1 is incorporated therein. In the present embodiment, in the substrate-provided structure 2, the support substrate 42 protecting the main surface 411 of the wiring body 41 is separated from the wiring body 41 as necessary, and the obtained conductor-layer-provided structure 1 is used to produce the touch input device. In this way, in the present embodiment, the main surface 411 of the wiring body 41 is inhibited from being damaged, and visibility of the wiring body 41 is inhibited from deteriorating by providing the support substrate 42 covering the main surface 411 of the wiring body 41.

Examples of a material included in the support substrate 42 may include a material to which various addition agents or fillers are added, and the various addition agents or fillers include polyethylene terephthalate (PET), a polyolefin film, polyvinyl chloride (PVC), polyethylene (PE), polypropylene (PP), polystyrene (PS), etc. As described in the foregoing, the support substrate 42 is separated at the time of incorporation into the touch input device, and does not affect visibility of the touch input device. Therefore, the material is not particularly restricted to the above-mentioned material, and a lower priced material may be used when the support substrate 42 may protect the main surface 411 of the wiring body 41. The "support substrate 42" in the present embodiment corresponds to an example of a "first substrate" in the invention.

In the present embodiment, Formula (7) below is satisfied in terms of suppressing deterioration of visibility of the wiring body 41 and preventing a defect in the wiring body 41.

$$0.01 \text{ N/cm} \leq N_1 \leq 1 \text{ N/cm} \tag{7}$$

However, in the above Formula (7), $N_1$ denotes peel strength between the first resin layer 5 and the support substrate 42. The peel strength in this specification is measured by a JIS method (JIS Z0237).

When $N_1$ is less than a lower limit of the above Formula (7), there is a concern that the first resin layer 5 and the support substrate 42 may be unintentionally separated from each other in a process of producing the wiring body 41. Meanwhile, when $N_1$ exceeds an upper limit of the above Formula (7), an excessively large force needs to be applied when the support substrate 42 is separated from the wiring body 41. Thus, there is a concern that the wiring body 41 may have a defect. $N_1$ is more preferably 0.2 N/cm or less (0.01 N/cm≤$N_1$≤0.2 N/cm) in terms of improving a peeling property between the first resin layer 5 and the support substrate 42.

The above Formula (7) is satisfied in the support substrate 42 of the present embodiment, and thus surface treatment is performed such that a main surface thereof (at least a main surface on a side facing the main surface 411 of the wiring body 41) is flat. Specifically, surface roughness Ra of the main surface of the support substrate 42 is preferably 0.1 µm or less, and is more preferably 0.05 µm or less. The surface roughness of the support substrate 42 may be obtained by removing an addition agent or a filler contained in the material included in the support substrate 42, or reducing a dimension of the filler (a filler diameter).

In addition, the invention is not particularly restricted to the above description. For example, the above Formula (7) may be satisfied by surface treatment for performing a coating process of forming a coating layer on the main surface of the support substrate 42. Examples of a material included in the coating layer may include a silicone-based material, a fluorine-based material, a graphite-based material, a ceramic-based material, an aluminum-based material, etc. A thickness of such a coating layer is preferably 1 µm or less. Examples of a method of forming the coating layer on the main surface of the support substrate 42 may include a method of applying a coating liquid containing the above-mentioned material to the main surface of the support substrate 42, and then drying, hardening, etc. the coating liquid.

A method of the surface treatment on the support substrate 42 is not restricted to the above-described method when the above Formula (7) may be satisfied, and a known method may be employed.

A configuration of the support substrate 42, which is provided on the main surface 411 of the wiring body 41 and directly comes into contact with the first resin layer 5, is not particularly restricted to the above description. For example, as illustrated in FIG. 6, a support substrate 42B may include a main body portion 421 and an adhesive portion 422 formed on one main surface of the main body portion 421. The main body portion 421 uses the same material as the above-mentioned material included in the support substrate 42 that does not include the adhesive portion 422. For example, the adhesive portion 422 uses a known adhesive such as an acrylic resin-based adhesive, a urethane resin-based adhesive, a polyester resin-based adhesive, etc. In a substrate-provided wiring body 4B, the support substrate 42B is provided on the wiring body 41 such that the adhesive portion 422 comes into contact with the main surface 411 of the wiring body 41. A statement "the support substrate 42B includes the adhesive portion 422" may mean that peel strength between the wiring body 41 (specifically, the first resin layer 5) and the support substrate 42B (specifically, the adhesive portion 422) satisfies the peel strength shown in the above Formula (7). Alternatively, the statement may mean that the support substrate 42 is accompanied by a portion corresponding to 99% or more of a whole volume of the adhesive portion 422 when the support substrate 42 is separated from the wiring body 41. Alternatively, the statement may mean that the support substrate 42 separated from the main surface 411 of the wiring body 41 adheres to the main surface 411 of the wiring body 41 again. Alternatively, the statement may mean that a thickness of the adhesive portion 422 is 1 µm or less and thinner than the main body portion 421 (for example, one tenth or less thereof), and is substantially integrated with the main body portion.

When the support substrate 41 includes the adhesive portion 422, the above-described surface treatment may not be performed on the main body portion 421. In the present embodiment, a phrase "the support substrate 42 which is provided on the main surface 411 of the wiring body 41 and directly comes into contact with the first resin layer 5" means that the support substrate 42 is provided on the main surface 411 of the wiring body 41 and directly comes into contact with the first resin layer 5 irrespective of the presence/absence of the adhesive portion 422.

As illustrated in FIG. 3, the adhesive layer 10 is used to bond the wiring body 41 (specifically, the main surface 412) to the cover glass 3. A known adhesive such as an acrylic resin-based adhesive, a urethane resin-based adhesive, a polyester resin-based adhesive, etc. may be used as the adhesive layer 10.

In the substrate-provided structure 2 of the present embodiment, the adhesive layer 10 is interposed between the cover glass 3 and the third resin layer 9. In other words, the wiring body 41 is disposed such that the second resin layer 7 is positioned on a side close to the cover glass 3 with respect to the first resin layer 5. In this way, a relatively flat surface in external shapes of first and second conductor wires 62 and 82 included in first and second net-shaped electrode layers 61 and 82 is disposed to face the cover glass 3 side, and thus it is possible to suppress occurrence of scattering, etc. of incident light entering from the cover glass 3 side. The "adhesive layer 10" in the present embodiment corresponds to an example of an "adhesive layer" in the invention.

Next, a description will be given of a method for producing the conductor-layer-provided structure 1 in the present embodiment. FIG. 7(a) to FIG. 7(f), FIG. 8(a) to FIG. 8(e), and FIG. 9(a) to FIG. 9(c) are cross-sectional views illustrating a method for producing a conductor-layer-provided structure according to an embodiment of the invention.

First, as illustrated in FIG. 7(a), intaglio 11, in which a recessed portion 111 having a shape corresponding to the shape of the first conductor layer 6 is formed, is prepared. Examples of a material included in the intaglio 11 may include glass of nickel, silicon, silicon dioxide, etc., organic silica, glassy carbon, a thermoplastic resin, a light curing resin, etc.

A depth of a portion of the recessed portion 111 corresponding to the first net-shaped electrode layer 61 is preferably within a range of 100 nm to 100 µm, more preferably within a range of 500 nm to 10 µm, and even more preferably within a range of 500 nm to 5 µm, and a width thereof is preferably within a range of 100 nm to 100 µm, more preferably within a range of 500 nm to 10 µm, and even more preferably within a range of 500 nm to 5 µm.

Meanwhile, a depth of a portion of the recessed portion 111 corresponding to the lead-out wire 66 is preferably the same as or deeper than that of the first net-shaped electrode layer 61, and is preferably within a range of 100 nm to 500 µm, more preferably within a range of 500 nm to 100 µm, and even more preferably within a range of 500 nm to 30 µm. Further, a width thereof is preferably wider than the first net-shaped electrode layer 61, and is preferably within a range of 1 µm to 500 µm, more preferably within a range of 1 µm to 100 µm, and even more preferably within a range of 1 µm to 30 µm. In the present embodiment, a cross-sectional shape of the recessed portion 111 corresponds to a tapered shape in which a width narrows toward a bottom portion.

A release layer (not illustrated) made of a graphite-based material, a silicone-based material, a fluorine-based material, a ceramic-based material, an aluminum-based material, etc. is preferably formed on a surface of the recessed portion 111 in advance to have a release property.

The recessed portion 111 of the intaglio 11 is filled with an electrically conductive material 12. The above-described conductive paste is used as the electrically conductive material 12.

Examples of a method of filling the recessed portion 111 of the intaglio 11 with the electrically conductive material 12 may include a dispensing method, an ink-jet method, screen printing, etc. Alternatively, the examples may include a method in which after coating using a slit coating method, a bar coating method, a blade coating method, a dip coating method, a spray coating method, or a spin coating method, the electrically conductive material coating a portion other than the recessed portion 111 is removed by wiping, scraping, sucking, sticking, washing, or blowing. A composition, etc. of the electrically conductive material may be appropriately used properly according to a shape of the intaglio, etc.

Subsequently, as illustrated in FIG. 7(*b*), the first conductor layer 6 is formed by heating the electrically conductive material 12 filling the recessed portion 111 of the intaglio 11. A condition for heating the electrically conductive material 12 may be appropriately set depending on the composition of the electrically conductive material, etc. The electrically conductive material 12 contracts in volume through a heating process, and a concave-convex shape is slightly formed on a surface of the electrically conductive material 12. In this instance, an external surface of the electrically conductive material 12 except for an upper surface is formed in a shape along the recessed portion 111.

A method of processing the electrically conductive material 12 is not restricted to heating. The electrically conductive material 12 may be irradiated with an energy ray such as an infrared ray, an ultraviolet ray, laser light, etc. or may only be dried. In addition, two or more types of these processing methods may be combined. Due to a concave-convex shape of a surface 121, a contact area between the first conductor layer 6 and the first resin layer 5 increases, and the first conductor layer 6 may be more strongly fixed to the first resin layer 5.

Subsequently, as illustrated in FIG. 7(*c*), a resin material 13 is applied onto the intaglio 11 (the intaglio 11 in a state illustrated in FIG. 7(*b*)) in which the first conductor layer 6 is formed. The above-mentioned material included in the first conductor layer 6 may be used as the resin material 13. Examples of a method of applying the resin material 13 onto the intaglio 11 may include screen printing, a spray coating method, a bar coating method, a dip method, an ink-jet method, etc.

Subsequently, as illustrated in FIG. 7(*d*), the support substrate 42 is disposed on the intaglio 11 such that the resin material 13 introduces into the recessed portion 111 of the intaglio 11, and the support substrate 42 is pressed against the intaglio 11 to harden the resin material 13. Examples of a method of hardening the resin material 13 may include irradiation with an energy ray such as an infrared ray, an ultraviolet ray, laser light, etc., heating, annealing, drying, etc. In this way, the first resin layer 5 is formed.

Incidentally, a method of forming the first resin layer 5 is not restricted to above description. For example, the first resin layer 5 may be formed by preparing a member, which is obtained by substantially uniformly applying the resin material 13 for forming the first resin layer 5 onto the support substrate 42, and hardening the resin material 13 while the support substrate 42 is pressed against the intaglio 11 such that the resin material 13 introduces into the recessed portion 111 of the intaglio 11. When the support substrate 42 includes the main body portion 21 and the adhesive portion 422, the support substrate 42 may be provided on the main surface 411 of the wiring body 41 such that the adhesive portion 422 directly comes into contact with the first resin layer 5 after the resin material 13 is hardened to form the first resin layer 5.

Subsequently, as illustrated in FIG. 7(*e*), the support substrate 42, the first resin layer 5, and the first conductor layer 6 are released from the intaglio 11.

Subsequently, as illustrated in FIG. 7(*f*), the resin material 14 included in the second resin layer 7 is applied onto the first resin layer 5. The above-mentioned material included in the second resin layer 7 is used as such a resin material 18.

Viscosity of the material included in the second resin layer 7 is preferably within a range of 1 mPa·s to 10,000 mPa·s in terms of ensuring sufficient fluidity at the time of application. In addition, storage elastic modulus of resin after hardening is preferably $10^6$ Pa or more and $10^9$ Pa or less in terms of durability of the first conductor layer 6 or the second conductor layer 8. Examples of a method of applying the resin material 14 onto the first resin layer 5 may include screen printing, a spray coating method, a bar coating method, a dip method, an ink-jet method, a cast method, etc. In this way, a first intermediary body 15 is obtained.

Subsequently, as illustrated in FIG. 8(*a*), intaglio 16, in which a recessed portion 161 having a shape corresponding to a shape of the second conductor layer 8 is formed, is prepared. Examples of a material included in the intaglio 16 may include the same material as the material included in the intaglio 11. In addition, a shape of the recessed portion 161 formed in the intaglio 16 corresponds to the second conductor layer 8. Since the second conductor layer 8 has the same configuration as that of the first conductor layer 6, a depth and a width of the recessed portion 161 have the same values as those of the above-described recessed portion 111.

Similarly to the recessed portion 111, a release layer (not illustrated) made of a graphite-based material, a silicone-based material, a fluorine-based material, a ceramic-based material, an aluminum-based material, etc. is preferably formed on a surface of the recessed portion 161 in advance to improve a release property.

The recessed portion 161 of the intaglio 16 is filled with an electrically conductive material 17. Examples of the electrically conductive material 17 may include the same material as the electrically conductive material 12. In addition, the same method as a method of filling the recessed portion 111 of the intaglio 11 with the electrically conductive material 12 may be used as a method of filling the recessed portion 161 of the intaglio 16 with the electrically conductive material 17.

Subsequently, as illustrated in FIG. 8(*b*), the second conductor layer 8 is formed by heating the electrically conductive material 17 that fills the recessed portion 161 of the intaglio 16. A condition for heating the electrically conductive material 17 may be appropriately set depending on the composition of the electrically conductive material, etc. The electrically conductive material 17 contracts in volume through this heating process, and a concave-convex shape is slightly formed on a surface 171 of the electrically conductive material 17. In this instance, an external surface of the electrically conductive material 17 except for an upper surface is formed in a shape along the recessed portion 161.

Due to the concave-convex shape of the surface 171, a contact area between the second conductor layer 8 and the second resin layer 7 increases, and the second conductor layer 8 may be more strongly fixed to the second resin layer 7. Similarly to the case of the electrically conductive material 12, a method of processing the electrically conductive material 17 is not restricted to heating.

Subsequently, as illustrated in FIG. 8(c), the first intermediary body 15 is disposed on the intaglio 16 such that the resin material 14 introduces into the recessed portion 161 of the intaglio 16, and the first intermediary body 15 is pressed against the intaglio 16 to harden the resin material 14. A welding force at the time of pressing the first intermediary body 15 against the intaglio 16 is preferably within a range of 0.001 MPa to 100 MPa, and more preferably within a range of 0.01 MPa to 10 MPa. Pressing may be performed using a pressure roller, etc. In this way, the second resin layer 7 is formed, and the first conductor layer 6 and the second conductor layer 8 are bonded and fixed to each other through the second resin layer 7.

Examples of a method of hardening the resin material 14 may include irradiation with an energy ray such as an infrared ray, an ultraviolet ray, laser light, etc., heating, annealing, drying, etc.

Then, as illustrated in FIG. 8(d), the first intermediary body 15 and the second conductor layer 8 are released from the intaglio 16.

Subsequently, as illustrated in FIG. 8(e), the resin material 18 included in the third resin layer 9 is applied onto the second resin layer 7. The above-mentioned material included in the third resin layer 9 is used as the resin material 18.

Viscosity of the material included in the third resin layer 9 is preferably within a range of 1 mPa·s to 10,000 mPa·s in terms of ensuring sufficient fluidity at the time of application. In addition, storage elastic modulus of resin after hardening is preferably $10^6$ Pa or more and $10^9$ Pa or less in terms of durability of the second conductor layer 8. Examples of a method of applying the resin material 18 onto the second resin layer 7 may include screen printing, a spray coating method, a bar coating method, a dip method, an ink-jet method, a cast method, etc.

Then, the resin material 18 is hardened to form the third resin layer 9. Examples of a method of hardening the resin material 18 may include irradiation with an energy ray such as an infrared ray, an ultraviolet ray, laser light, etc., heating, annealing, drying, etc. In this way, the substrate-provided wiring body 4 is obtained (first process).

Subsequently, as illustrated in FIG. 9(a), an adhesive material 19 included in the adhesive layer 10 is applied onto the cover glass 3. Examples of the adhesive material 19 may include acrylic resin, urethane resin, polyester resin, etc. Examples of a method of applying the adhesive material 19 onto the cover glass 3 may include screen printing, a spray coating method, a bar coating method, a dip method, an ink-jet method, a cast method, etc. Unlike the above description, the adhesive material 19 may be applied onto the substrate-provided wiring body 4 (specifically, the main surface 412).

Subsequently, as illustrated in FIG. 9(b), the substrate-provided wiring body 4 is pressed against the cover glass 3 while the adhesive material 19 is interposed therebetween (second process), and the adhesive material 19 is hardened. Examples of a method of hardening the adhesive material 19 may include irradiation with an energy ray such as an infrared ray, an ultraviolet ray, laser light, etc., heating, annealing, drying, etc. When the adhesive material 19 is hardened, the adhesive layer 10 is formed. In this way, the cover glass 3 is provided on the main surface 412 of the wiring body 41 through the adhesive layer 10, and the substrate-provided structure 2 is obtained.

Then, as illustrated in FIG. 9(c), the conductor-layer-provided structure 1 may be obtained by peeling off the support substrate 42 in the substrate-provided structure 2 to expose the wiring body 41 (specifically, the main surface 411) (third process). In this way, in the present embodiment, the wiring body 41 is inhibited from being damaged in a process of producing the conductor-layer-provided structure 1, and visibility of the wiring body 41 is inhibited from deteriorating by providing the support substrate 42 that protects the main surface 411 of the wiring body 41. In addition, when the wiring body 41 is supported by the support substrate 42, the wiring body 41 may be easily conveyed, and thus producing efficiency of the conductor-layer-provided structure 1 may be improved.

The method for producing the conductor-layer-provided structure 1, the substrate-provided wiring body 4, and the substrate-provided structure 2 in the present embodiment accomplish the following effects.

In the present embodiment, the wiring body 41 may be inhibited from being damaged in the producing process, and visibility of the wiring body 41 may be inhibited from deteriorating by providing the support substrate 42 that protects the main surface 411 of the wiring body 41.

In addition, in the present embodiment, when the wiring body 41 is supported by the support substrate 42, the wiring body 41 may be easily conveyed, and thus producing efficiency of the conductor-layer-provided structure 1 may be improved.

In addition, in the present embodiment, the support substrate 42 is peeled off from the wiring body 41 after the substrate-provided wiring body 4 is supported by the cover glass 3. Thus, the wiring body 41 may be prevented from being damaged by peeling off the support substrate 42 while the substrate-provided wiring body 4 is not supported by the cover glass 3.

In addition, in the present embodiment, after the adhesive material 19 is applied onto the cover glass 3, the cover glass 3 is pressed against the substrate-provided wiring body 4 through the adhesive material 19. In this way, the main surface 411 of the wiring body 4 may be inhibited from being damaged by performing an operation of applying the adhesive material 19 onto the relatively fragile wiring body 41, and visibility of the wiring body 41 may be inhibited from deteriorating.

In addition, in the present embodiment, when the above Formula (7) is satisfied, the first resin layer 5 and the support substrate 42 may be inhibited from being unintentionally peeled off in the process of producing the wiring body 41, and the wiring body 41 may be prevented from having a defect due to an excessively large force applied thereto when the support substrate 42 is peeled off from the wiring body 41.

Further, in the present embodiment, when the surface roughness of the conductor layer contact surface 63 is relatively rougher than the surface roughness of the conductor layer top surface 64, the first net-shaped electrode layer 61 and the first resin layer 5 may be strongly fixed to each other.

Further, in the substrate-provided structure 2 of the present embodiment, the adhesive layer 10 is interposed between the cover glass 3 and the third resin layer 9. In other words, the wiring body 41 is disposed such that the second resin layer 7 is positioned on a side close to the cover glass 3 with respect to the first resin layer 5. In this way, a relatively flat surface in external shapes of first and second conductor wires 62 and 82 included in first and second net-shaped electrode layers 61 and 82 is disposed to face the cover glass 3 side, and thus it is possible to suppress occurrence of scattering, etc. of incident light entering from the cover glass 3 side.

In addition, in the wiring body 4 of the present embodiment, a focus is on a relative relation between surface roughness (that is, a roughness parameter obtained by excluding a wavelength component) of the conductor layer contact surface 63 of the first conductor wire 62 and surface roughness of surfaces thereof except for the conductor layer contact surface 63 (the surfaces including the conductor layer top surface 64 and the conductor layer side surface 65) in the section view of the first conductor wire 62 in the short direction. Further, the surface roughness Ra of the conductor layer contact surface 63 is set to be relatively rougher than the surface roughness Ra of the surfaces except for the conductor layer contact surface 63. For this reason, it is possible to suppress diffused reflection of light entering from the outside while strongly bonding the first resin layer 5 and the first net-shaped electrode layer 61 together. In particular, when the width of the first conductor wire 62 is within a range of 1 μm to 5 μm, and when a relative relation between the surface roughness of the conductor layer contact surface 63 and the surface roughness of the surfaces except for the conductor layer contact surface 63 satisfies the above-described relation, it is possible to noticeably accomplish the effect that diffused reflection of light entering from the outside may be suppressed while strongly bonding the first resin layer 5 and the first net-shaped electrode layer 61 together.

In addition, in the present embodiment, the conductor layer side surface 65 extends to substantially match the virtual straight line passing through the end portions 651 and 652. In this case, a portion of the side surface has a shape which is not present on the inside of the virtual straight line passing through both ends of the side surface in the cross section of the first conductor wire 62 in the width direction, and thus diffused reflection of light entering from the outside of the wiring body 4 is suppressed. In this way, visibility of the wiring body 41 may be further improved.

In addition, in the present embodiment, when the surface roughness Ra of the conductor layer contact surface 63 is set to be relatively rougher than the surface roughness Ra of surfaces except for the conductor layer contact surface 63 (the surface including the conductor layer top surface 64 and the conductor layer side surface 65), a diffuse reflectance on a side of the surfaces except for the conductor layer contact surface 63 is relatively smaller than a diffuse reflectance on a side of the conductor layer contact surface 63. Herein, when the diffuse reflectance of the wiring body 41 is small, it is possible to inhibit the first conductor wire 62 from appearing white, and to suppress a decrease in contract in a region in which the first conductor wire 62 may be visually recognized. In this way, it is possible to further improve visibility of the wiring body 41 of the present embodiment.

The above-described embodiment has been described to facilitate understanding of the invention, and has not been described to restrict the invention. Therefore, each element disclosed in the above embodiment is intended to include all changes of design or equivalents falling within a technical scope of the invention.

For example, in the present embodiment, the above Formula (7) is satisfied by performing surface treatment on the support substrate 42. However, the invention is not restricted thereto. The above Formula (7) may be satisfied by performing surface treatment on the main surface 411 of the wiring body 41 (that is, a surface on a lower side of the first resin layer 5) directly coming into contact with the support substrate 42. Alternatively, the above Formula (7) may be satisfied by including various mold releasing agents, etc. in the material included in the first resin layer 5.

Figure 10:
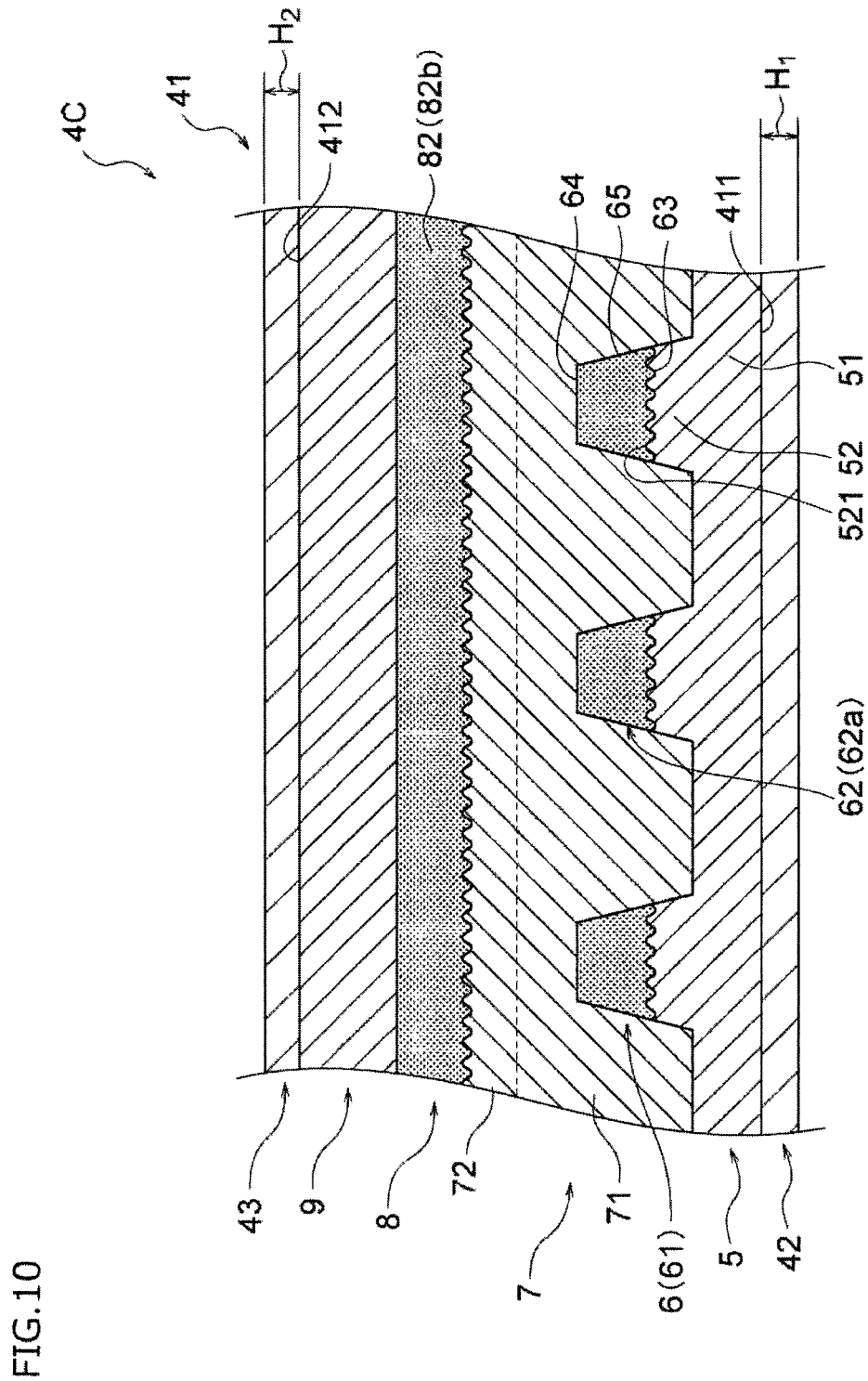
FIG. 10 is a cross-sectional view illustrating a second modified example of the substrate-provided wiring body according to the embodiment of the invention.

In addition, as illustrated in FIG. 10, a substrate-provided wiring body 4C may include the protective substrate 43 on the main surface 412 which is a surface on an opposite side from the main surface 411 on which the support substrate 42 is positioned. FIG. 10 is a cross-sectional view illustrating a second modified example of the substrate-provided wiring body according to the embodiment of the invention.

The protective substrate 43 is a film-shaped member, directly comes into contact with the main surface 412 of the wiring body 41, and has a function of protecting the main surface 412 from the outside. The main surface 412 of the wiring body 41 includes a third resin layer 9. The third resin layer 9 is interposed between a second conductor layer 8 and the protective substrate 43, and directly comes into contact with the protective substrate 43. In this case, the third resin layer 9 may be provided to cover the second conductor layer 8, and Young's modulus of a material included in the third resin layer 9 is not particularly restricted.

Examples of a material included in the protective substrate 43 may include polyethylene terephthalate (PET), a polyolefin film, polyvinyl chloride (PVC), polyethylene (PE), polypropylene (PP), polystyrene (PS), etc. The "protective substrate 43" in the present embodiment corresponds to an example of a "second substrate" in the invention.

In addition, in the present embodiment, Formula (8) below is preferably satisfied in terms of suppressing deterioration of visibility of the wiring body 41 and preventing a defect in the wiring body 41.

$$0.01 \text{ N/cm} \leq N_2 \leq 1 \text{ N/cm} \tag{8}$$

However, in the above Formula (8), $N_2$ denotes peel strength between the second resin layer 7 and the protective substrate 43.

When $N_2$ is less than a lower limit of the above Formula (8), there is a concern that the second resin layer 7 and the protective substrate 43 may be unintentionally peeled off in a process of producing the wiring body 41. Meanwhile, when $N_2$ exceeds an upper limit of above Formula (7), an excessively large force needs to be applied when the protective substrate 43 is peeled off from the wiring body 41. Thus, there is a concern that the wiring body 41 may have a defect. $N_2$ is preferably 0.2 N/cm or less (0.01 N/cm≤$N_2$≤0.2 N/cm) in terms of improving a peeling property between the second resin layer 7 and the protective substrate 43.

In addition, Formula (9) below is more preferably satisfied in the substrate-provided wiring body 4C.

$$N_2 < N_1 \tag{9}$$

However, in the above Formula (9), $N_1$ denotes peel strength between the first resin layer 5 and the support substrate 42, and $N_2$ denotes peel strength between the second resin layer 7 and the protective substrate 43.

In the process of producing the conductor-layer-provided structure 1, the protective substrate 43 is peeled off from the wiring body 41 before the support substrate 42 is peeled off from the wiring body 41. In this case, when the above Formula (9) is satisfied, the support substrate 42 may be inhibited from being unintentionally peeled off at the time of attempting to peel off the protective substrate 43.

When surface treatment is performed on the main surface of the support substrate 42 and the main surface of the protective substrate 43 such that the main surfaces are smoothened, the above Formula (9) may be satisfied by adjusting content of the addition agent contained in the support substrate 42 and content of the addition agent contained in the material included in the protective substrate 43. Alternatively, the above Formula (9) may be satisfied by setting a dimension of the filler contained in the material included in the support substrate 42 to be larger than a dimension of the filler contained in the material included in the protective substrate 43.

Meanwhile, when a coating process is performed on the main surface of the support substrate 42 and the main surface of the protective substrate 43 such that coating layers are formed, the above Formula (9) may be satisfied by selecting a material having a sufficient release property as the material included in the support substrate 42 rather than as the material included in the protective substrate 43.

In this example, Formula (10) below is preferably satisfied.

$$H_2 > H_1 \quad (10)$$

However, in the above Formula (10), $H_1$ denotes a height of the support substrate 42, and $H_2$ denotes a height of the protective substrate 43.

In this way, when the above Formula (10) is satisfied, and the height of the support substrate 42 is set to be relatively smaller than the height of the protective substrate 43 (the support substrate 42 is set to be relatively thin), flexibility is improved when the substrate-provided wiring body 4C is bonded to the cover glass 3, entrainment of bubbles, etc. may be suppressed, and thus productivity is improved. In particular, the above-described effects are more noticeable when the support is bent. Specifically, the height of the support substrate 42 is preferably 25 μm or more and 75 μm or less (25 μm≤$H_1$≤75 μm).

Meanwhile, when the height of the protective substrate 43 is set to be relatively larger than the height of the support substrate 42 (the protective substrate 43 is set to be relatively thick), rigidity is enhanced at the time of conveying the substrate-provided wiring body 4C, generation of a wrinkle, bending, a dent, etc. may be suppressed, and thus productivity is improved. Specifically, the height of the protective substrate 43 is preferably 50 μm or more and 150 μm or less (50 μm≤$H_2$≤150 μm).

As illustrated in FIG. 11(a) to FIG. 11(e), the substrate-provided wiring body 4C is produced as below. FIG. 11(a) to FIG. 11(e) are cross-sectional views illustrating a modified example of the method for producing the conductor-layer-provided structure according to the embodiment of the invention.

In more detail, after the resin material 18 included in the third resin layer 9 is applied (see FIG. 8(e)), the protective substrate 43 is pressed while the resin material 18 is interposed, thereby hardening the resin material 18. In this way, as illustrated in FIG. 11(a), the substrate-provided wiring body 4C is obtained. Alternatively, after the third resin layer 9 is formed by hardening the resin material 18 (see FIG. 8(e)), the protective substrate 43 to which an adhesive is applied is stacked.

Figure 11C:
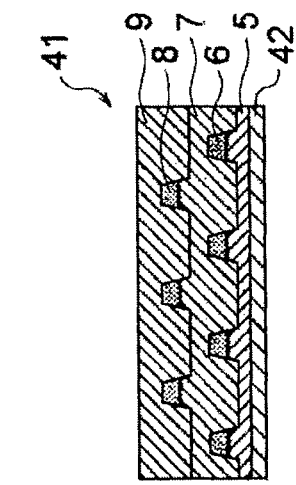
FIG. 11(a) to FIG. 11(e) are cross-sectional views illustrating a modified example of the method for producing the conductor-layer-provided structure according to the embodiment of the invention.
Figure 11B:
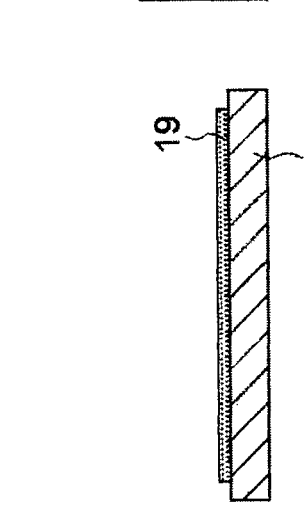
Figure 11E:
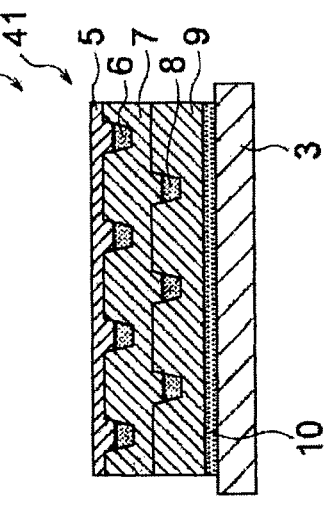
Figure 11A:
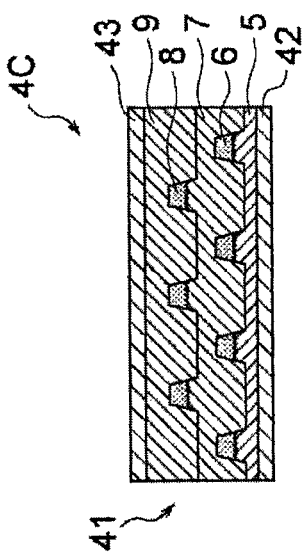
Figure 11D:
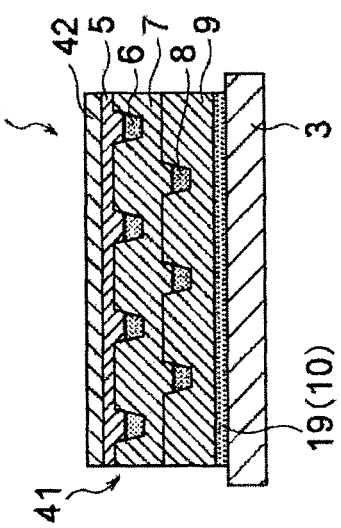

When the substrate-provided structure 2 is produced using the substrate-provided wiring body 4C, after the adhesive material 19 included in the adhesive layer 10 is applied onto the cover glass 3 (see FIG. 11(b)), the protective substrate 43 is peeled off from the wiring body 41 to expose the main surface 412 (see FIG. 11(c)), the wiring body 41 and the support substrate 42 are pressed against the cover glass 3 while the adhesive material 19 is interposed therebetween, thereby hardening the adhesive material 19 (FIG. 11(d)). In this way, the substrate-provided structure 2 is obtained.

Then, similarly to the above description, the conductor-layer-provided structure 1 may be obtained by peeling off the support substrate 42 from the wiring body 41 to expose the main surface 411 (FIG. 11(e)). In this example, when the main surface 411 of the wiring body 41 is protected by the support substrate 42, and the main surface 412 is protected by the protective substrate 43, the wiring body 41 may be further inhibited from being damaged, and visibility may be further inhibited from deteriorating in the process of producing the conductor-layer-provided structure 1.

In addition, for example, the touch sensor of the present embodiment is a touch panel sensor corresponding to a projection-type capacitive sensing method having two electrodes. However, the invention is not particularly restricted thereto. The invention is applicable to a touch panel sensor corresponding to a surface-type (capacitive coupling-type) capacitive sensing method having one electrode.

In addition, for example, in the present embodiment, the metal material or the carbon-based material is used as the conductive powder included in the first and second net-shaped electrode layers 61 and 81. However, the invention is not particularly restricted thereto, and the metal material mixed with the carbon-based material may be used. In this case, for example, when a description is given using the first conductor wire 62 as an example, the carbon-based material may be disposed on the conductor layer top surface 64 side of the first conductor wire 62, and the metal material may be disposed on the conductor layer contact surface 63 side. Alternatively, reversely, the metal material may be disposed on the conductor layer top surface 64 side of the first conductor wire 62, and the carbon-based material may be disposed on the conductor layer contact surface 63 side.

In addition, for example, in the present embodiment, the conductor-layer-provided structure 1 (the substrate-provided structure 2) is configured using the cover glass 3 as a support. The invention is not particularly restricted thereto. When an image display device included in the touch input device is a liquid crystal display, a deflecting plate or a color filter may be used as a support. In addition, when the touch input device has a hard coat layer, an antistatic layer, an antiglare layer, an antifouling layer, an antireflection layer, a high dielectric layer, or an electromagnetic wave shielding layer, these layers may be used as a support.

In place of the liquid crystal display (liquid crystal panel), various image display panels such as a plasma display panel (PDP), an electroluminescent display (ELD) panel, a cathode ray tube (CRT), a surface-conduction electron-emitter display (SED) panel, etc. may be used as the image display device of the touch input device.

In addition, the substrate-provided structure 2 of the present embodiment may include the adhesive layer 10 that bonds the wiring body 41 and the cover glass 3 together.

However, the adhesive layer 10 may be omitted, and the third resin layer 9 of the wiring body 41 may be used as an adhesive layer. The "third resin layer 9" of this example corresponds to an example of a "second resin layer" and an "adhesive layer" in the invention.

In addition, the wiring body 41 of the present embodiment includes a plurality of (two in the above embodiment) conductor layers 6 and 8 provided on the first resin layer 5 with the second resin layer 7 interposed therebetween in a height direction of the wiring body 41 (a direction in which the resin layer and the conductor layer are stacked). However, the invention is not particularly restricted thereto. It is possible to employ a configuration in which only the first conductor layer 6 is included. When the wiring body 41 includes one conductor layer, a conductor layer farthest away from the main surface 411 among the conductor layers included in the wiring body 41 refers to the first conductor layer 6. In this case, the second resin layer 7 covering the first conductor layer 6 corresponds to an example of a "second resin layer" in the invention.

In addition, in the case of the above-described example, the adhesive layer bonding the wiring body 41 and the cover glass 3 together may include the second resin layer 7. In this case, the "second resin layer 7" of this example corresponds to an example of a "second resin layer" and an "adhesive layer" in the invention.

In addition, in the above-described embodiment, a description has been given on the assumption that the substrate-provided wiring body is used for the touch input device. However, use of the substrate-provided wiring body is not particularly restricted thereto. For example, the wiring body may be used as a heater by electrifying the wiring body to generate heat using resistance heating, etc. In this case, a carbon-based material having relatively high electrical resistivity is preferably used as conductive powder. Alternatively, the wiring body may be used as an electromagnetic shield by grounding a part of a conductor of the wiring body. Alternatively, the wiring body may be used as an antenna. In this case, a mounting object on which the wiring body is mounted corresponds to an example of a "support" of the invention, and the heater, the electromagnetic shield, and the antenna including the mounting object correspond to an example of a "substrate-provided structure" in the invention.

EXPLANATIONS OF LETTERS OR NUMERALS

1 . . . conductor-layer-provided structure
2 . . . substrate-provided structure
3 . . . cover glass
31 . . . main surface
4, 4B, 4C . . . substrate-provided wiring body
41 . . . wiring body
411, 412 . . . main surface
5 . . . first resin layer
51 . . . flat portion
52 . . . support portion
521 . . . resin layer contact surface
6 . . . first conductor layer
61 . . . first net-shaped electrode layer
62a, 62b . . . first conductor wire
63 . . . conductor layer contact surface
64 . . . conductor layer top surface
641 . . . top surface flat portion
65 . . . conductor layer side surface
651, 652 . . . end portion
653 . . . side surface flat portion
66 . . . lead-out wire
67 . . . lead-out portion
7 . . . second resin layer
71 . . . main portion
72 . . . support portion
8 . . . second conductor layer
81 . . . second net-shaped electrode layer
82a, 82b . . . second conductor wire
83 . . . lead-out wire
84 . . . lead-out portion
9 . . . third resin layer
42 . . . support substrate
421 . . . main body portion
422 . . . adhesive portion
43 . . . protective substrate
10 . . . adhesive layer
11 . . . intaglio
111 . . . recessed portion
12 . . . electrically conductive material
121 . . . surface
13 . . . resin material
14 . . . resin material
15 . . . first intermediary body
16 . . . intaglio
161 . . . recessed portion
17 . . . electrically conductive material
171 . . . surface
18 . . . resin material
19 . . . adhesive material
100 . . . touch sensor

The invention claimed is:

1. A method for producing a conductor-layer-provided structure comprising:
a first process of preparing a substrate-provided wiring body including a wiring body including a first resin layer and a conductor layer provided on the first resin layer, and a first substrate provided on one main surface of the wiring body so as to directly come into contact with the first resin layer;
a second process of bonding the other main surface of the wiring body to a support; and
a third process of peeling off the first substrate from the wiring body, wherein
the following Formula (1) is satisfied:

$$0.01 \text{ N/cm} \leq N_1 \leq 1 \text{ N/cm} \tag{1}$$

in the Formula (1), $N_1$ denotes peel strength between the first resin layer and the first substrate.

2. The method according to claim 1, wherein the second process includes interposing an adhesive layer between the wiring body and the support.

3. The method according to claim 2, wherein the second process includes bonding the support to the wiring body through the adhesive layer after the adhesive layer is formed on the support.

4. The method according to claim 1, wherein the wiring body further includes a second resin layer interposed between the conductor layer and the support and bonded to the support.

5. The method according to claim 1, wherein
the substrate-provided wiring body further includes a second substrate provided on the other main surface of the wiring body, and
the second process includes:
peeling off the second substrate from the substrate-provided wiring body; and bonding the other main surface of the wiring body to the support after the second substrate is peeled off from the substrate-provided wiring body.

6. The method according to claim 5, wherein the following Formula (2) is satisfied:

$$H_2 > H_1 \qquad (2)$$

in the Formula (2), $H_1$ denotes a height of the first substrate, and $H_2$ denotes a height of the second substrate.

7. The method according to claim 1, wherein the conductor layer includes a conductor wire, the conductor wire includes:
   a first surface positioned on a side of the first resin layer;
   a second surface on an opposite side from the first surface; and
   two side surfaces inclined such that the side surfaces approach each other as being separated from the first resin layer in a cross section of the conductor wire in a short direction, and
surface roughness of the first surface is rougher than surface roughness of the second surface.

8. A substrate-provided wiring body comprising:
a wiring body including a first resin layer and a conductor layer provided on the first resin layer; and
a first substrate provided on one main surface of the wiring body so as to directly come into contact with the first resin layer, wherein
the wiring body further includes a second resin layer covering a conductor layer farthest away from one main surface of the wiring body among conductor layers included in the wiring body, and
the following Formula (3) is satisfied:

$$0.01 \text{ N/cm} \leq N_1 \leq 1 \text{ N/cm} \qquad (3)$$

in the Formula (3), $N_1$ denotes peel strength between the first resin layer and the first substrate.

9. The substrate-provided wiring body according to claim 8, further comprising
a second substrate provided on the second resin layer, wherein
the following Formula (4) is satisfied:

$$0.01 \text{ N/cm} \leq N_2 \leq 1 \text{ N/cm} \qquad (4)$$

in the Formula (4), $N_2$ denotes peel strength between the second resin layer and the second substrate.

10. The substrate-provided wiring body according to claim 9, wherein
the following Formula (5) is satisfied:

$$N_2 < N_1 \qquad (5)$$

in the Formula (5), $N_1$ denotes peel strength between the first resin layer and the first substrate, and $N_2$ denotes peel strength between the second resin layer and the second substrate.

11. The substrate-provided wiring body according to claim 9, wherein the following Formula (6) is satisfied:

$$H_2 > H_1 \qquad (6)$$

in the Formula (6), $H_1$ denotes a height of the first substrate, and $H_2$ denotes a height of the second substrate.

12. The substrate-provided wiring body according to claim 8, wherein the conductor layer includes a conductor wire,
the conductor wire includes:
   a first surface positioned on a side of the first resin layer;
   a second surface on an opposite side from the first surface; and
   two side surfaces inclined such that the side surfaces approach each other as being separated from the first resin layer in a cross section of the conductor wire in a short direction, and
surface roughness of the first surface is rougher than surface roughness of the second surface.

13. A substrate-provided structure comprising:
the substrate-provided wiring body according to claim 8; and
a support provided on the other main surface of the wiring body.

14. The substrate-provided structure according to claim 13, further comprising an adhesive layer interposed between the wiring body and the support to bond the wiring body and the support to each other.

15. A touch sensor comprising:
the substrate-provided structure according to claim 13.

* * * * *